(12) United States Patent
Nishizaki

(10) Patent No.: US 11,495,282 B2
(45) Date of Patent: Nov. 8, 2022

(54) SENSE AMPLIFIER DRIVERS, AND RELATED DEVICES, SYSTEMS, AND METHODS

(71) Applicant: Micron Technology, Inc., Boise, ID (US)

(72) Inventor: Mamoru Nishizaki, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 71 days.

(21) Appl. No.: 16/991,290

(22) Filed: Aug. 12, 2020

(65) Prior Publication Data

US 2022/0051712 A1 Feb. 17, 2022

(51) Int. Cl.
  *G11C 11/4091* (2006.01)
  *H01L 27/108* (2006.01)
  *H01L 23/528* (2006.01)

(52) U.S. Cl.
  CPC ........ *G11C 11/4091* (2013.01); *H01L 23/528* (2013.01); *H01L 27/10897* (2013.01)

(58) Field of Classification Search
  CPC .............. G11C 11/4091; H01L 23/528; H01L 27/10897
  USPC ....................................................... 365/149
  See application file for complete search history.

(56) References Cited

U.S. PATENT DOCUMENTS

| 5,973,352 | A | * | 10/1999 | Noble | .................. H01L 27/115 257/315 |
|---|---|---|---|---|---|
| 6,674,678 | B2 | | 1/2004 | Kato | |
| 9,704,573 | B1 | * | 7/2017 | Hecht | ................ G11C 13/0028 |
| 2004/0156256 | A1 | | 8/2004 | Schreck | |
| 2009/0310432 | A1 | | 12/2009 | Yang et al. | |
| 2014/0103537 | A1 | * | 4/2014 | Kaibara | .................. H01L 24/08 257/773 |
| 2018/0026125 | A1 | * | 1/2018 | Liao | .................... H01L 23/5283 257/316 |
| 2020/0411500 | A1 | * | 12/2020 | Holland | .............. H01L 27/0629 |

* cited by examiner

*Primary Examiner* — Sung Il Cho
(74) *Attorney, Agent, or Firm* — TraskBritt

(57) ABSTRACT

Drivers for sense amplifiers are disclosed. A driver may include two or more drain areas extending in a first direction and two or more source areas extending in the first direction. The driver may also include a drain interconnection including two or more first drain-interconnection portions which extend in the first direction above the two of more drain areas and one or more second drain-interconnection portions extending in a second direction between the two or more first drain-interconnection portions. The driver may also include a source interconnection including two or more first source-interconnection portions extending in the first direction above the two or more source areas and one or more second source-interconnection portions extending in the second direction between the two or more first source-interconnection portions. Associated systems are also disclosed.

20 Claims, 28 Drawing Sheets

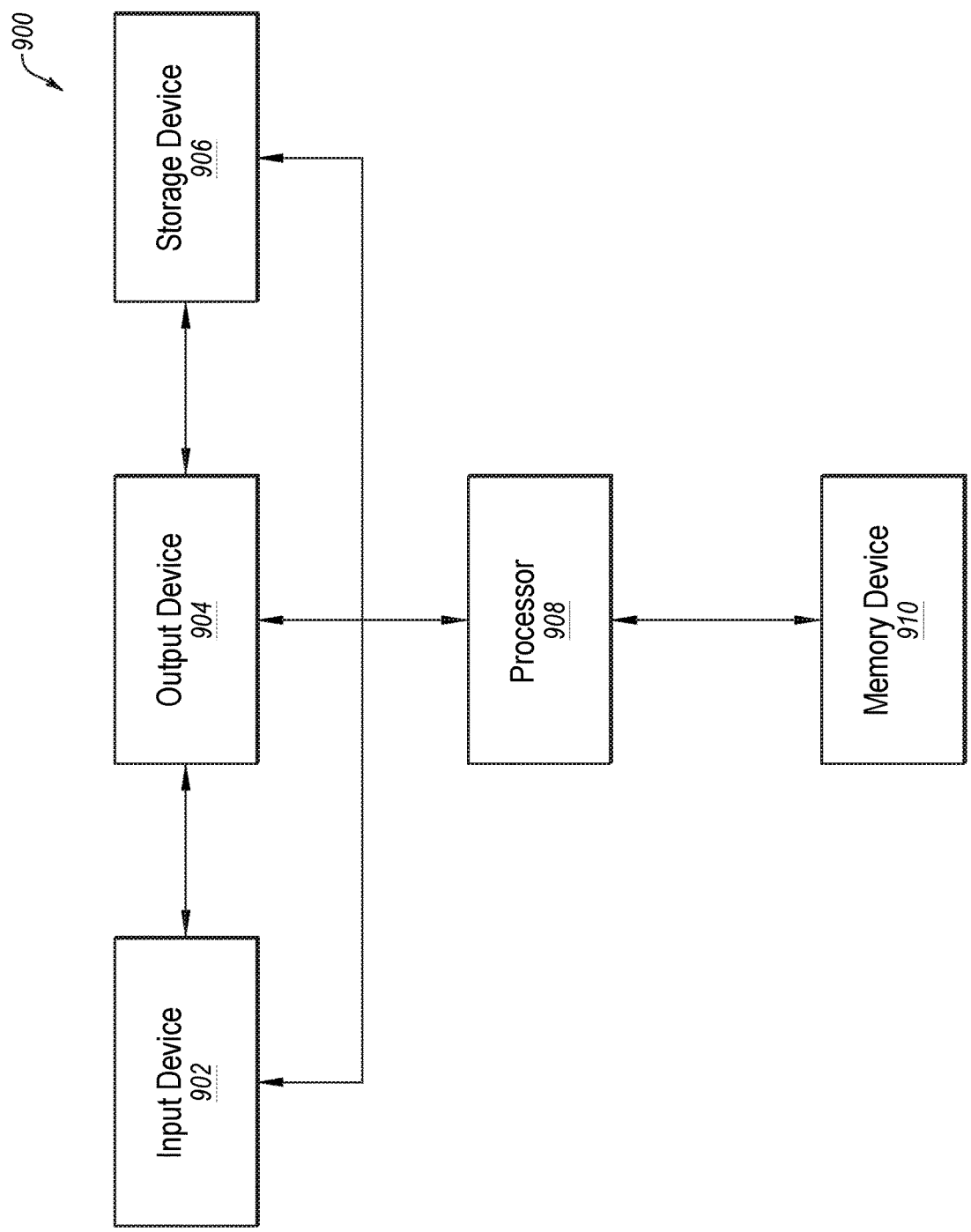

SENSE AMPLIFIER DRIVERS, AND RELATED DEVICES, SYSTEMS, AND METHODS

TECHNICAL FIELD

Embodiments of the disclosure relate to microelectronic devices. More specifically, various embodiments relate to microelectronic devices including memory cells (e.g., memory devices), sense amplifiers, and sense-amplifier drivers, and to related methods, devices, and systems.

BACKGROUND

Microelectronic devices, including memory devices may include a sense amplifier. The sense amplifier may be configured to sense a difference between two sensed values (e.g., sensed voltages) and amplify the sensed difference. A sense-amplifier driver may be configured to provide a voltage to the sense amplifier. The sense-amplifier driver may be configured to provide a voltage to the sense amplifier under some conditions and to not provide a voltage to the sense amplifier under other, different conditions. By providing the voltage or not providing the voltage, the sense-amplifier driver may control operation of the sense amplifier. By controlling the operation of the sense amplifier, the sense-amplifier driver may conserver power when compared with a sense amplifier that is not controlled by a sense-amplifier driver. In other words, arranging a sense-amplifier driver between a voltage line and a sense amplifier may allow for conservation of power.

BRIEF DESCRIPTION OF THE SEVERAL VIEWS OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIG. 9 is a simplified block diagram illustrating an example electronic system, in accordance with at least one embodiment of the present disclosure.

DETAILED DESCRIPTION

A sense-amplifier driver may be configured to provide voltage to a sense amplifier. In some cases, the sense-amplifier driver may be configured to provide the voltage under some conditions and not provide the voltage under other, different conditions. For example, a sense-amplifier driver may include a transistor configured to provide voltage to a sense amplifier based on and/or responsive to a voltage at a gate of the transistor.

Systems, methods, and/or devices of the present disclosure may have less electrical impedance than other systems, methods, and/or devices. In particular, a sense-amplifier-driver transistor of the present disclosure may have less electrical impedance than other sense-amplifier-driver transistors. A sense-amplifier-driver transistor that has less electrical impedance than other sense-amplifier-driver transistors may represent an improvement in sense-amplifier-driver transistors. For example, decreasing electrical impedance of a sense-amplifier-driver transistor may result in power savings. Additionally, decreasing electrical impedance may result in one or more additional improvements to sense amplifier characteristics, for example, a sense margin may be improved (e.g., secured).

A sense-amplifier-driver transistor in accordance with at least one embodiment of the present disclosure may include changes to the structure of the sense-amplifier-driver transistor when compared with other sense-amplifier-driver transistors. These changes may include, for example, changes to shapes of metal layers of the sense-amplifier-driver transistor, changes in the arrangement of a source and a drain of the sense-amplifier-driver transistor, and changes to connections between the sense-amplifier-driver transistor and a sense amplifier. These changes may allow a sense-amplifier-driver transistor in accordance with at least one embodiment of the present disclosure to include, for example, larger metal elements, interconnections, plates, and/or lines, larger inter-layer contacts, and/or additional inter-layer contacts. These changes may result in lower electrical impedance compared with other sense-amplifier-driver transistors.

Figure 1:
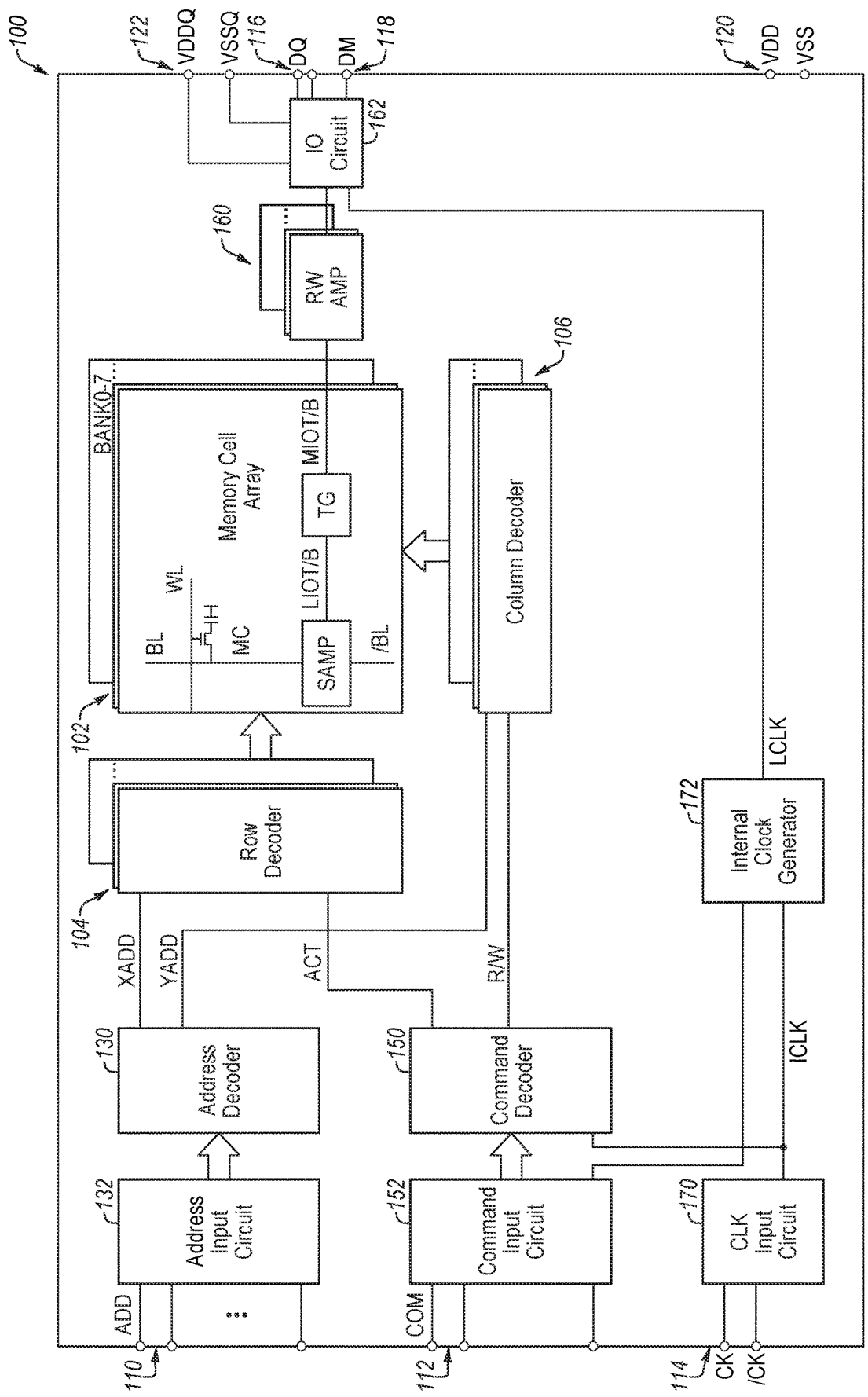
FIG. 1 is a block diagram illustrating an example memory device, in accordance with at least one embodiment of the present disclosure.

FIG. 1 is a functional block diagram illustrating example memory device 100, in accordance with at least one embodiment of the present disclosure. Memory device 100 may include, for example, a DRAM (dynamic random access memory), a SRAM (static random access memory), a SDRAM (synchronous dynamic random access memory), a DDR SDRAM (double data rate SDRAM, such as a DDR4 SDRAM and the like), or a SGRAM (synchronous graphics random access memory). Memory device 100, which may be integrated on a semiconductor chip, may include memory array 102.

In the embodiment of FIG. 1, memory array 102 is shown as including eight memory banks BANK0-7. More or fewer banks may be included in memory array 102 of other embodiments. Each memory bank includes a number of access lines (word lines WL), a number of data lines (bit lines BL) and /BL, and a number of memory cells MC arranged at intersections of the number of word lines WL and the number of bit lines BL and /BL. The selection of a word line WL may be performed by row decoder 104 and the selection of the bit lines BL and /BL may be performed by column decoder 106. In the embodiment of FIG. 1, row decoder 104 may include a respective row decoder for each memory bank BANK0-7, and column decoder 106 may include a respective column decoder for each memory bank BANK0-7.

The bit lines BL and /BL are coupled to a respective sense amplifier SAMP. Read data from the bit line BL or /BL may be amplified by the sense amplifier SAMP, and transferred to read/write amplifiers 160 over complementary local data lines (LIOT/B), a transfer gate (TG), and complementary main data lines (MIOT/B). Conversely, write data outputted from read/write amplifiers 160 may be transferred to the sense amplifier SAMP over the complementary main data lines MIOT/B, the transfer gate TG, and the complementary local data lines LIOT/B, and written in the memory cell MC coupled to the bit line BL or /BL.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as power supply terminal 120 and power supply terminal 122.

During a contemplated operation, one or more command signals COM, received via command terminals 112, may be conveyed to command decoder 150 via command input circuit 152. Command decoder 150 may include a circuit configured to generate various internal commands via decoding the one or more command signals COM. Examples of the internal commands include an active command ACT and a read/write signal R/W.

Further, one or more address signals ADD, received via address terminals 110, may be conveyed to address decoder 130 via address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

The active command ACT may include a pulse signal that is activated in response to a command signal COM indicating row access (e.g., an active command). In response to the active signal ACT, row decoder 104 of a specified bank address may be activated. As a result, the word line WL specified by row address XADD may be selected and activated.

The read/write signal R/W may include a pulse signal that is activated in response to a command signal COM indicating column access (e.g., a read command or a write command). In response to the read/write signal R/W, column decoder 106 may be activated, and the bit line BL specified by the column address YADD may be selected.

In response to the active command ACT, a read signal, a row address XADD, and a column address YADD, data may be read from the memory cell MC specified by the row address XADD and the column address YADD. The read data may be output via sense amplifier SAMP, the transfer gate TG, read/write amplifiers 160, input/output circuit 162, and data terminals 116. Further, in response the active command ACT, a write signal, a row address XADD, and a column address YADD, write data may be supplied to memory array 102 via data terminals 116, input/output circuit 162, read/write amplifiers 160, transfer gate TG, and sense amplifier SAMP. The write data may be written to the memory cell MC specified by the row address XADD and the column address YADD.

Clock signals CK and /CK may be received via clock terminals 114. Clock input circuit 170 may generate internal clock signals ICLK based on the clock signals CK and /CK. Internal clock signals ICLK may be conveyed to various components of memory device 100, such as command decoder 150 and internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When the data mask signal DM is activated, overwrite of corresponding data may be prohibited.

Figure 2:
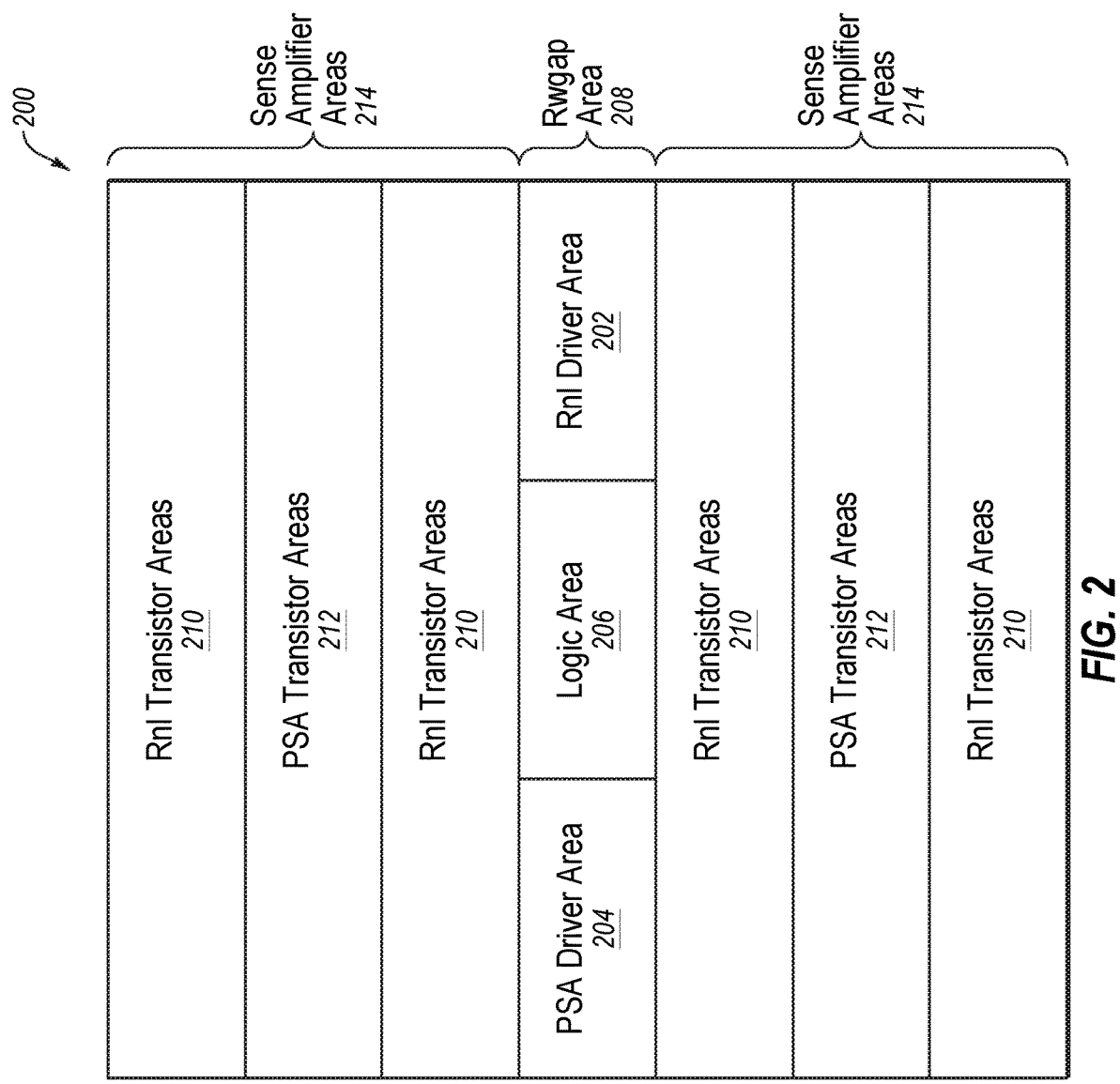
FIG. 2 is a layout diagram illustrating an example sense amplifier area in accordance with at least one embodiment of the present disclosure.

FIG. 2 is a layout diagram illustrating an example sense amplifier area 200 in accordance with at least one embodiment of the present disclosure. Sense amplifier area 200 includes Rwgap area 208 and sense amplifier areas 214.

Sense amplifier areas 214 may provide a location for transistors of sense amplifiers (e.g., sense amplifier SAMP of FIG. 1). Sense amplifier areas 214 may include one or more of each of Rnl transistor areas 210 and PSA transistor areas 212.

Rnl transistor areas 210 may provide locations for gates, sources, and/or drains for one or more Rnl transistors. In the present disclosure, "Rnl transistor" may refer to an n-type metal-oxide semiconductor (NMOS) transistor that is part of a sense amplifier. For example, Rnl transistor areas 210 closest to Rwgap area 208 may provide locations for sources of one or more Rnl transistors. Additionally, Rnl transistor areas 210 farthest from Rwgap area 208 may provide locations for drains of one or more Rnl transistors.

PSA transistor areas 212 may provide locations for gates, sources, and/or drains for one or more PSA transistors. In the present disclosure, "PSA transistor" may refer to a p-type metal-oxide semiconductor (PMOS) transistor that is part of a sense amplifier.

The Rwgap area 208 may provide locations for circuits, logic, transistors, and/or lines that may be used in connection with a sense amplifier (e.g., sense amplifier SAMP of FIG. 1). Rwgap area 208 includes areas for one or more of PSA driver area 204, logic area 206, and Rnl driver area 202.

Rnl driver area 202 may be a location provided for one or more transistors that may be (or be part of) a sense-amplifier-driver transistor, in particular, an Rnl driver transistor. In other words, Rnl driver area 202 may provide locations for a gate, a source, and/or a drain of an Rnl driver transistor. As described below, there may be more than one area that makes up the locations for one or more of the gate, source and drain. For example, there may be multiple drain areas that make up a drain of the Rnl driver transistor.

PSA driver area 204 may be a location provided for one or more transistors that may be (or be part of) a sense-amplifier-driver transistor, in particular, a PSA driver transistor. In other words, PSA driver area 204 may provide locations for a gate, a source, and/or a drain of a PSA driver transistor. There may be more than one area that makes up the locations for one or more of the gate, source and drain.

Logic area 206 may provide a location for logic circuits or parts thereof configured for operation with a sense amplifier. For example, logic area 206 may provide a location for a Local Input/Output (LIO) amplifier, a common equalizer (e.g., an equalizer for RnlF and ActF), and/or a pre-charger transistor.

Figure 3:
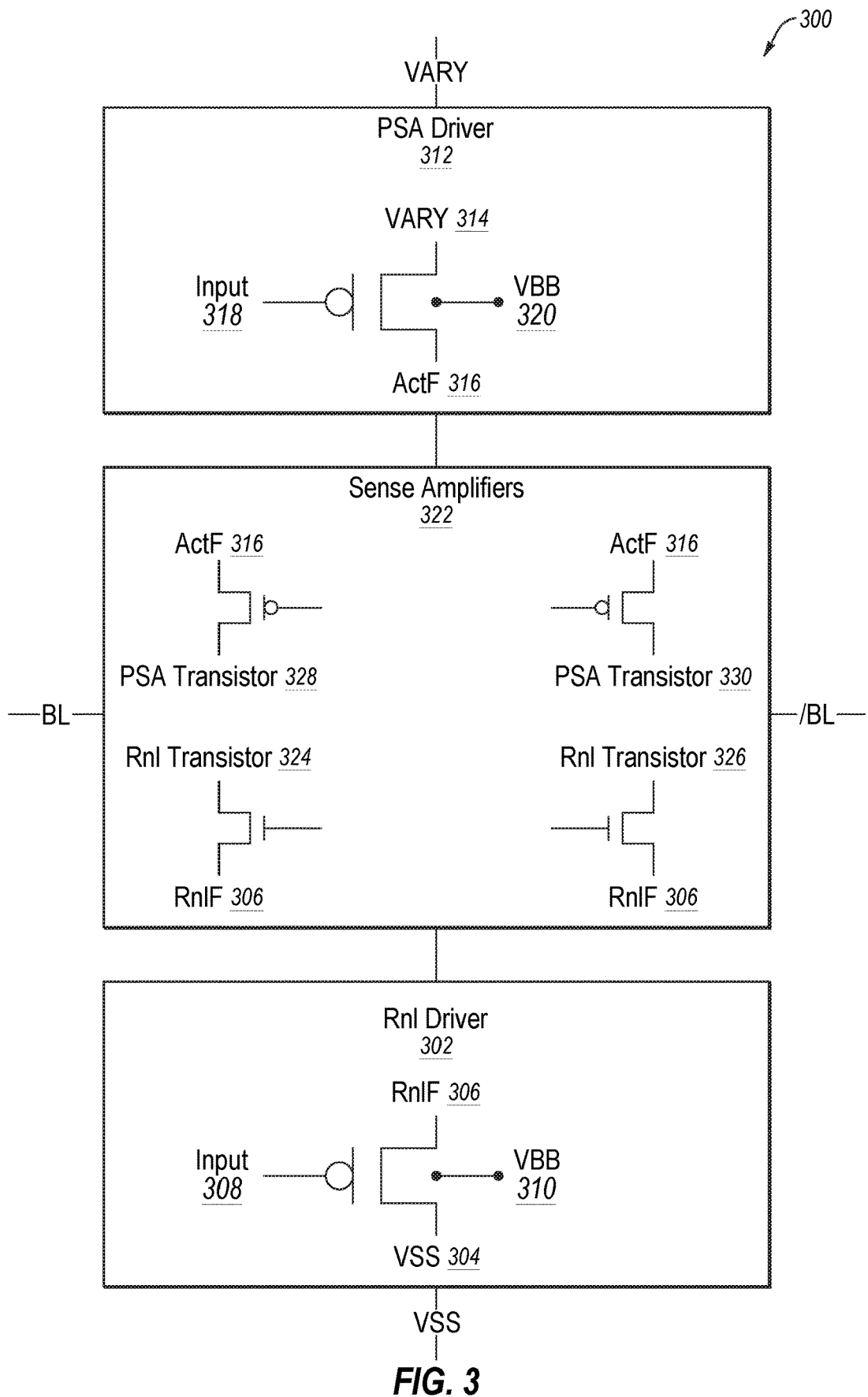
FIG. 3 is a functional block diagram illustrating an example circuit in accordance with at least one embodiment of the present disclosure.

FIG. 3 is a functional block diagram illustrating an example circuit 300 in accordance with at least one embodiment of the present disclosure. Circuit 300 includes Rnl driver 302, PSA driver 312, and sense amplifiers 322. In relation to FIG. 2, Rnl driver 302 may be arranged in Rnl driver area 202, PSA driver 312 may be arranged in PSA driver area 204, and one or more of drains, gates, and sources of transistors of sense amplifiers 322 may be arranged in sense amplifier areas 214.

Sense amplifiers 322 may be configured to amplify voltage differences between one or more BLs and one or more corresponding/BLs. For example, a BL may be electrically coupled to an input of Rnl transistor 324 and a corresponding /BL may be electrically coupled to an input of Rnl transistor 326. Rnl transistor 324 and Rnl transistor 326 may be configured to cause a line electrically coupled to a drain of one of Rnl transistor 324 or Rnl transistor 326 to receive a voltage based on a difference between the voltage on the BL and the /BL. The voltage that Rnl transistor 324 and Rnl transistor 326 cause to be received at the drain of one of Rnl transistor 324 and Rnl transistor 326 may be the voltage at a source of each of Rnl transistor 324 and Rnl transistor 326, e.g., a voltage at RnlF 306. Similarly, PSA transistor 328 and PSA transistor 330 may amplify a voltage difference between BL and /BL by allowing a voltage at a node or line ActF 316 to be connected to one of PSA transistor 328 or PSA transistor 330.

Rnl driver 302 may be configured to provide a voltage (e.g., a voltage from a voltage line—VSS) to sense amplifiers 322, or more specifically, to a node or line RnlF 306, which may be electrically coupled to a source of each of Rnl transistor 324 and Rnl transistor 326 (and possibly additional Rnl transistors not illustrated in FIG. 3). Rnl driver 302 includes an NMOS transistor, which may include a source electrically coupled to a voltage line, e.g., VSS 304, a gate electrically coupled to input 308, and a drain electrically coupled to sense amplifiers 322 or more specifically, to a node or line RnlF 306, which may be electrically coupled to a source of each of Rnl transistor 324 and Rnl transistor 326 (and possibly additional Rnl transistors not illustrated in FIG. 3). Additionally, Rnl driver 302 includes a body node electrically coupled to VBB 310.

PSA driver 312 may be configured to provide a voltage (e.g., a voltage from a voltage line—VARY) to sense amplifiers 322, or more specifically, to a node or line ActF 316, which may be electrically coupled to a source of each of PSA transistor 328 and PSA transistor 330 (and possibly additional PSA transistors not illustrated in FIG. 3). PSA driver 312 includes a PMOS transistor, which includes a source electrically coupled to a voltage line, e.g., VARY 314, a gate electrically coupled to input 318, and a drain electrically coupled to sense amplifiers 322 or more specifically, to a node or line ActF 316, which may be electrically coupled to a source of each of PSA transistor 328 and PSA transistor 330 (and possibly additional PSA transistors not illustrated in FIG. 3). Additionally, PSA driver 312 includes a body node electrically coupled to VBB 320.

An example sense-amplifier driver 400 of FIG. 4A-FIG. 4F may be an example of a sense-amplifier-driver transistor. In particular, sense-amplifier driver 400 may be an example of Rnl driver 302 of FIG. 3, which may be configured to provide voltage from a voltage line (e.g., VSS) to one or more Rnl transistors (e.g., Rnl transistor 324 and Rnl transistor 326). Further, sense-amplifier driver 400 may be an example of an Rnl driver arranged in Rnl driver area 202.

Figure 4A:
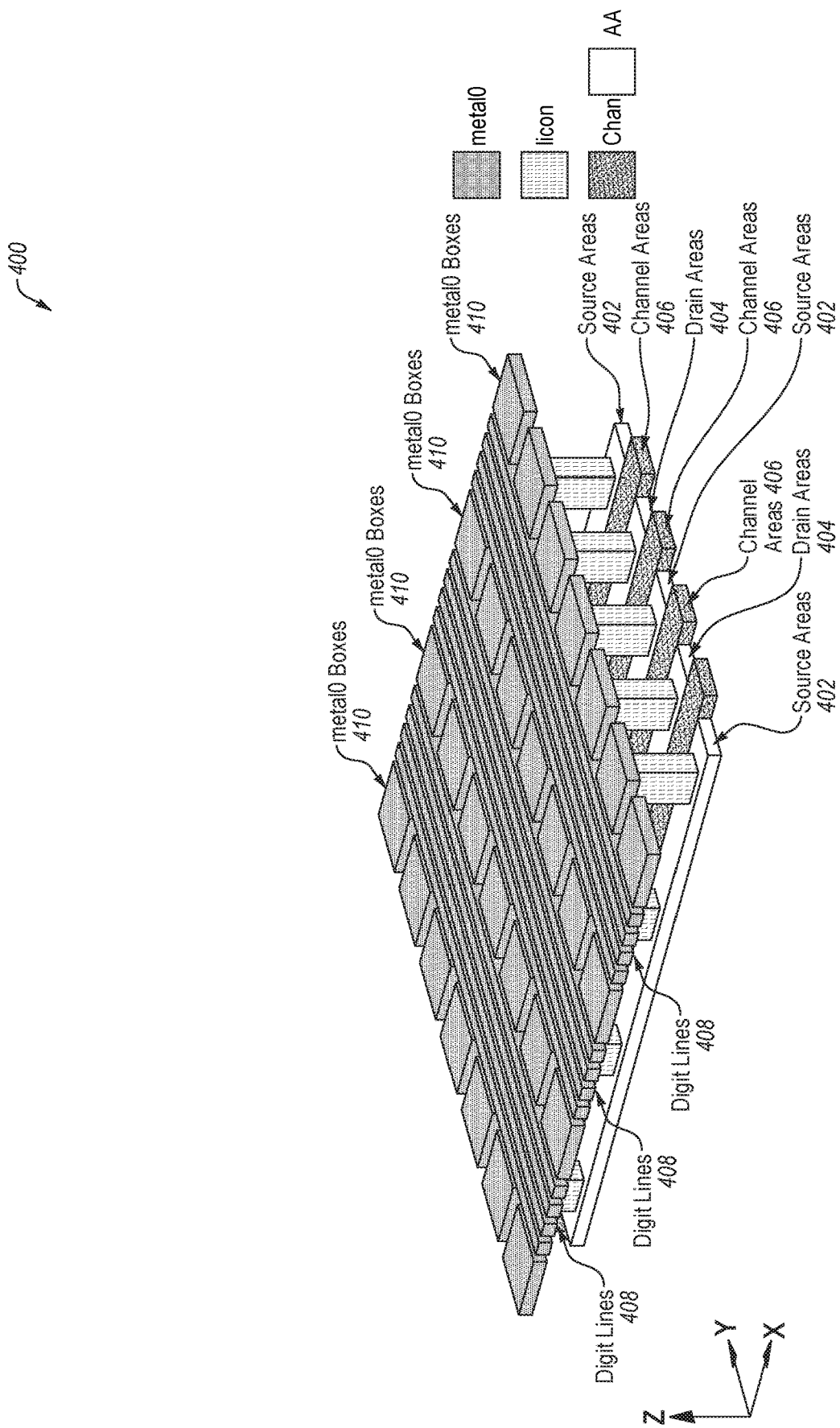
FIG. 4A-FIG. 4C are perspective views illustrating various layers of an example sense-amplifier driver.
Figure 4B:
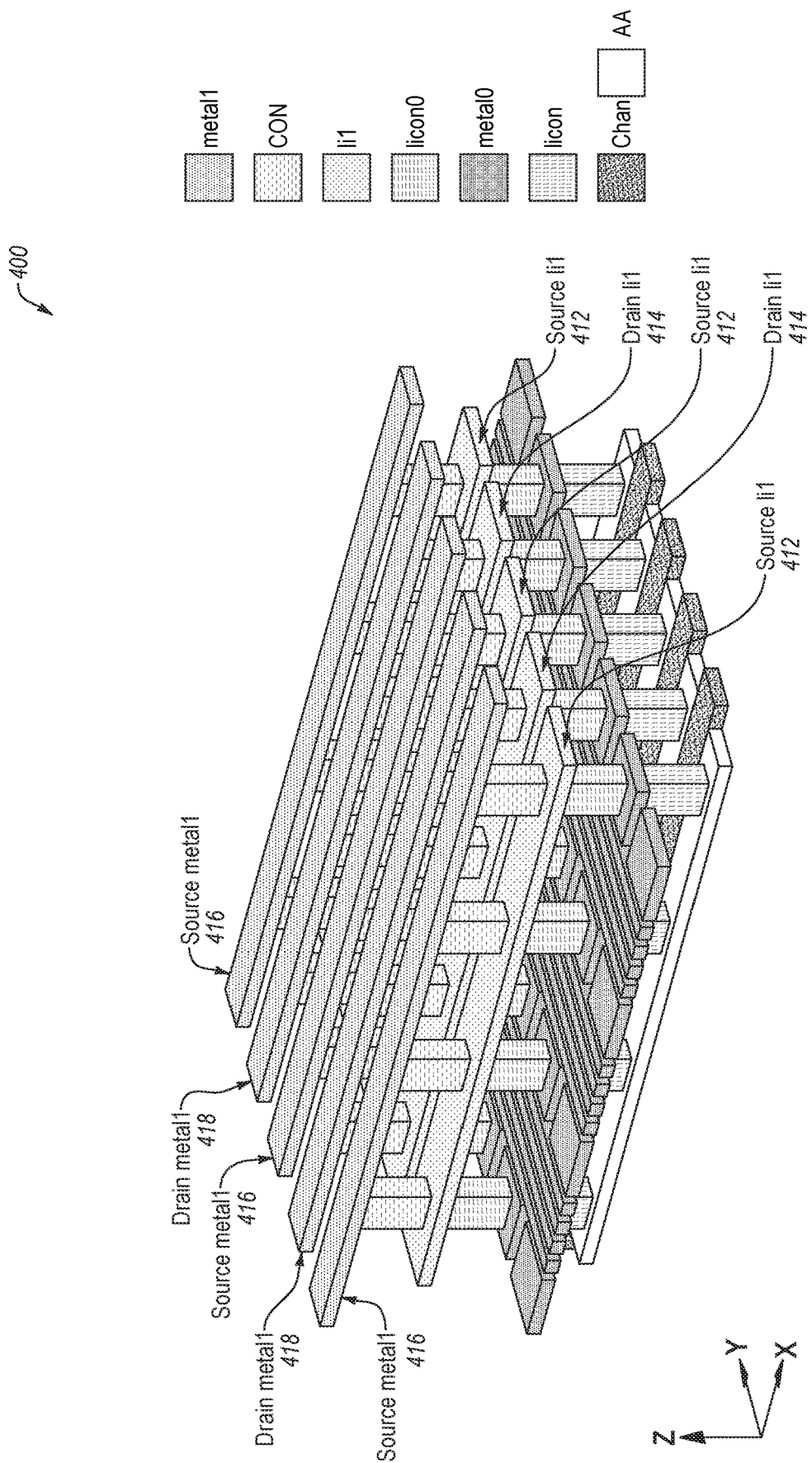
Figure 4C:
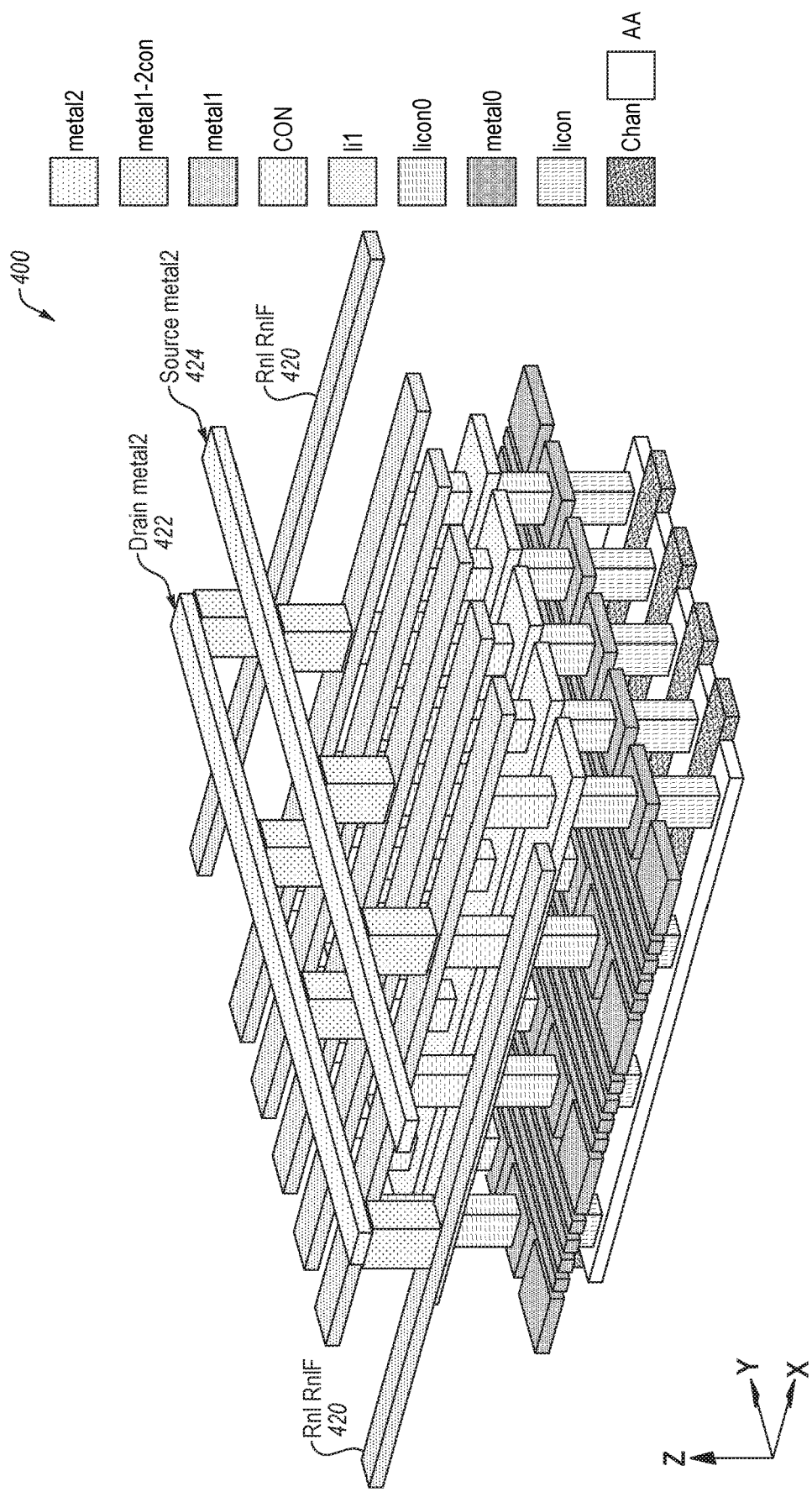

FIG. 4A-FIG. 4C are perspective views illustrating various layers of sense-amplifier driver 400. In particular, FIG. 4A illustrates sense-amplifier driver 400 including a channel ("Chan")/Active Area (AA) layer and a metal0 layer above the channel/AA layer.

The channel/AA layer may include a layer of silicon configured to be used as source and drain of a transistor and as a channel area between the source and drain. Gate areas (not illustrated) of the transistor may be formed above the channel areas 406 and may be formed of polysilicon. The channel/AA layer includes source areas 402, drain areas 404, and channel areas 406. The channel/AA layer may include portions of silicon doped in various ways (e.g., neutral, p-type, and n-type). For example, the channel areas 406 may be P– doped and the source areas 402 and drain areas 404 may be N+ doped. The channel/AA layer may be a single layer. Source areas 402, drain areas 404, and channel areas 406 may extend in an x-direction (e.g., a first direction).

Sense-amplifier driver 400 may be and/or include a transistor including source areas 402, drain areas 404, and gate areas above channel areas 406. The various layers above the channel/AA layer may provide for electrical coupling to source areas 402, and drain areas 404. Additionally, though not illustrated, there may be various elements and/or lines providing for electrical coupling to gate areas above channel areas 406.

The metal0 layer may be a layer of a conductive material (e.g., copper, silver, or gold) arranged above the channel/AA layer. The metal0 layer may include elements and/or lines that may be configured to electrically couple portions of a memory device (e.g., memory device 100) including, e.g., sense-amplifier driver 400. Specifically, the metal0 layer may include digit lines 408 which may be examples of bit lines, e.g., BL and /BL of FIG. 1. Digit lines 408 may extend in a y-direction (e.g., a second direction). Digit lines 408 may extend beyond sense-amplifier driver 400 e.g., to provide for electrical coupling for the portions of the memory device. In some embodiments, there may or may not be electrical coupling between elements and/or lines of sense-amplifier driver 400 and digit lines 408. Additionally, metal0 layer may include metal0 boxes 410 which may provide for electrical connection between the channel/AA layer and a layer above the metal0 layer.

Between the channel/AA layer and the metal0 layer there may be a licon layer that may include inter-layer contacts. The inter-layer contacts in the licon layer may provide for electrical coupling between elements and/or lines of the channel/AA layer and elements and/or lines of the metal0 layer. For example, source areas 402 may be connected to metal0 boxes 410 through several inter-layer contacts. The various inter-layer contacts may extend in a z-direction (e.g., a third direction).

Additionally, the licon layer and/or the metal0 layer may include an insulator (not illustrated). The insulator may allow for electrical isolation between the elements and/or lines of the channel/AA layer and the elements and/or lines of the metal0 layer. Additionally, the insulator may provide electrical isolation between the various elements and/or lines of the metal0 layer. For example, each of digit lines 408 may be electrically isolated from each of the other digit lines 408 and metal0 boxes 410 by the insulator. The insulator may be or include an electrically insulating material, e.g., silicon nitride, air, silicon dioxide, or a polymer.

FIG. 4B illustrates sense-amplifier driver 400 including an li1 layer above the metal0 layer and a metal1 layer above the li1 layer. Each of the li1 layer and the metal1 layer may be similar to the metal0 layer in that they may be made up of conductive material arranged in elements and/or lines and an insulator between the metal elements and/or lines.

Between the li1 layer and the metal0 layer there may be a licon0 layer and between the li1 layer and the metal1 layer there may be a CON layer. The licon0 layer and the CON layer may be similar to the licon layer in that the licon0 layer and the CON layer may include an insulator and inter-layer contacts arranged to electrically isolate and electrically couple, respectively, elements and/or lines of the metal0 layer, the li1 layer, and the metal1 layer.

FIG. 4B illustrates source li1 412 and source metal1 416 arranged in the li1 layer and the metal1 layer, respectively, above source areas 402 (see FIG. 4A). Source li1 412 and source metal1 416 may provide for an electrical coupling to source areas 402. As illustrated in FIG. 4B, source metal1 416 may be electrically coupled to source li1 412 through inter-layer contacts in the CON layer and source li1 412 may be electrically coupled to metal0 boxes 410 that are above source areas 402 through inter-layer contacts in the licon0 layer. Thus, source metal1 416 may provide a location for electrical coupling to source areas 402 of sense-amplifier driver 400.

Similarly, FIG. 4B illustrates drain li1 414 and drain metal1 418 arranged in the li1 layer and the metal1 layer, respectively, above drain areas 404. Drain li1 414 and drain metal1 418 may provide for an electrical coupling to drain areas 404. As illustrated in FIG. 4B, the drain metal1 418 may be electrically coupled to drain li1 414 through inter-layer contacts in the CON layer and drain li1 414 may be electrically coupled to metal0 boxes 410 that are above drain areas 404 through inter-layer contacts in the licon0 layer. Thus, drain metal1 418 may provide a location for electrical coupling to drain areas 404 of sense-amplifier driver 400.

In the present disclosure, elements and/or lines electrically coupled to a source area may be referred to as "source" by virtue of their connection to a source area. Similarly, lines or shapes electrically coupled to a drain area may be referred to as "drain" by virtue of their connection to a drain area. This is for descriptive purposes. For example, there may be no difference between the source li1 412 and the drain li1 414 other than the electrical coupling between the source li1 412 and source areas 402 and the electrical coupling between drain li1 414 and drain areas 404.

FIG. 4C illustrates sense-amplifier driver 400 including a metal2 layer above the metal1 layer. Additionally, FIG. 4C illustrates Rnl RnlF 420 which may be part of a sense amplifier.

The metal2 layer may be similar to the metal0 layer, the li1 layer, and the metal1 layer in that the metal2 layer may be made up of conductive material arranged in elements and/or lines and an insulator between the metal elements and/or lines.

Between the metal2 layer and the metal1 layer there may be a metal1-2con layer. The metal1-2con layer may be similar to the licon layer, the licon0 layer, and the CON layer in that the metal1-2con layer may include an insulator and inter-layer contacts arranged to electrically isolate and electrically couple, respectively, elements and/or lines of the metal1 layer and the metal2 layer.

As illustrated in FIG. 4A-FIG. 4C, sense-amplifier driver 400 may include source areas 402 and drain areas 404 extending in the x-direction. Sense-amplifier driver 400 may include source li1 412 and drain li1 414 arranged above source areas 402 and drain areas 404 respectively. Source li1 412 and drain li1 414 may also extend in the x-direction. Sense-amplifier driver 400 may include source metal1 416 and drain metal1 418 arranged above source li1 412 and drain li1 414 respectively. Source metal1 416 and drain metal1 418 may also extend in the x-direction. The metal2 layer may include drain metal2 422 and source metal2 424 which may extend in the y-direction, which may cross (e.g., be perpendicular to) the x-direction.

For example, the x-direction and the y-direction of FIG. 4A-FIG. 4C may correspond to the x-direction and the y-direction respectively of FIG. 2. Thus, if sense-amplifier driver 400 is an Rnl driver transistor arranged in Rnl driver area 202 of FIG. 2, source areas 402, drain areas 404, channel areas 406, source li1 412, drain li1 414, source metal1 416, and drain metal1 418 may extend in the x-direction in Rnl driver area 202 and drain metal2 422 and source metal2 424 may extend in the y-direction beyond Rnl driver area 202. In particular, drain metal2 422 and source metal2 424 may provide for electrical coupling to the Rnl driver transistor. For example, drain metal2 422 may be configured to provide for electrical coupling to a drain of the Rnl driver transistor and source metal2 424 may be configured to provide for electrical coupling to a source of the Rnl driver transistor.

Drain metal2 422 may be configured to provide for electrical coupling between a drain (e.g., drain areas 404) of an NMOS transistor (e.g., sense-amplifier driver 400) and a node, e.g., Rnl RnlF 420. Rnl RnlF 420 may be electrical electrically coupled to a source of an Rnl transistor (e.g., arranged in Rnl transistor areas 210).

Source metal2 424 may be configured to provide for electrical coupling between a source (e.g., source areas 402) of the NMOS transistor (e.g., sense-amplifier driver 400) and a voltage line.

Sense-amplifier driver 400 may be an example of Rnl driver 302 of FIG. 3. For example, drain metal2 422 may be configured to provide for electrical coupling between a drain (e.g., drain areas 404) of an NMOS transistor (e.g., sense-amplifier driver 400) and a node or line Rnl RnlF 420 (which may be an example of RnlF 306). Source metal2 424 may be configured to provide for electrical coupling between a source (e.g., source areas 402) of the NMOS transistor (e.g., sense-amplifier driver 400) and a voltage line (e.g., VSS).

Additionally, a PSA driver transistor may have layers and electrical couplings that are the same as or substantially similar to those described with regard to sense-amplifier driver 400. In particular, a PSA driver transistor may include source areas, drain areas, and channel areas and metal layers. The metal layers may provide for electrical coupling to the source areas, the drain areas, and the gate areas above the channel areas. For example, the metal layers may provide for an electrical coupling between a PSA ActF node and the drain areas. Additionally, the metal layers may provide for an electrical coupling between a voltage line—VARY and the source areas.

Figure 4D:
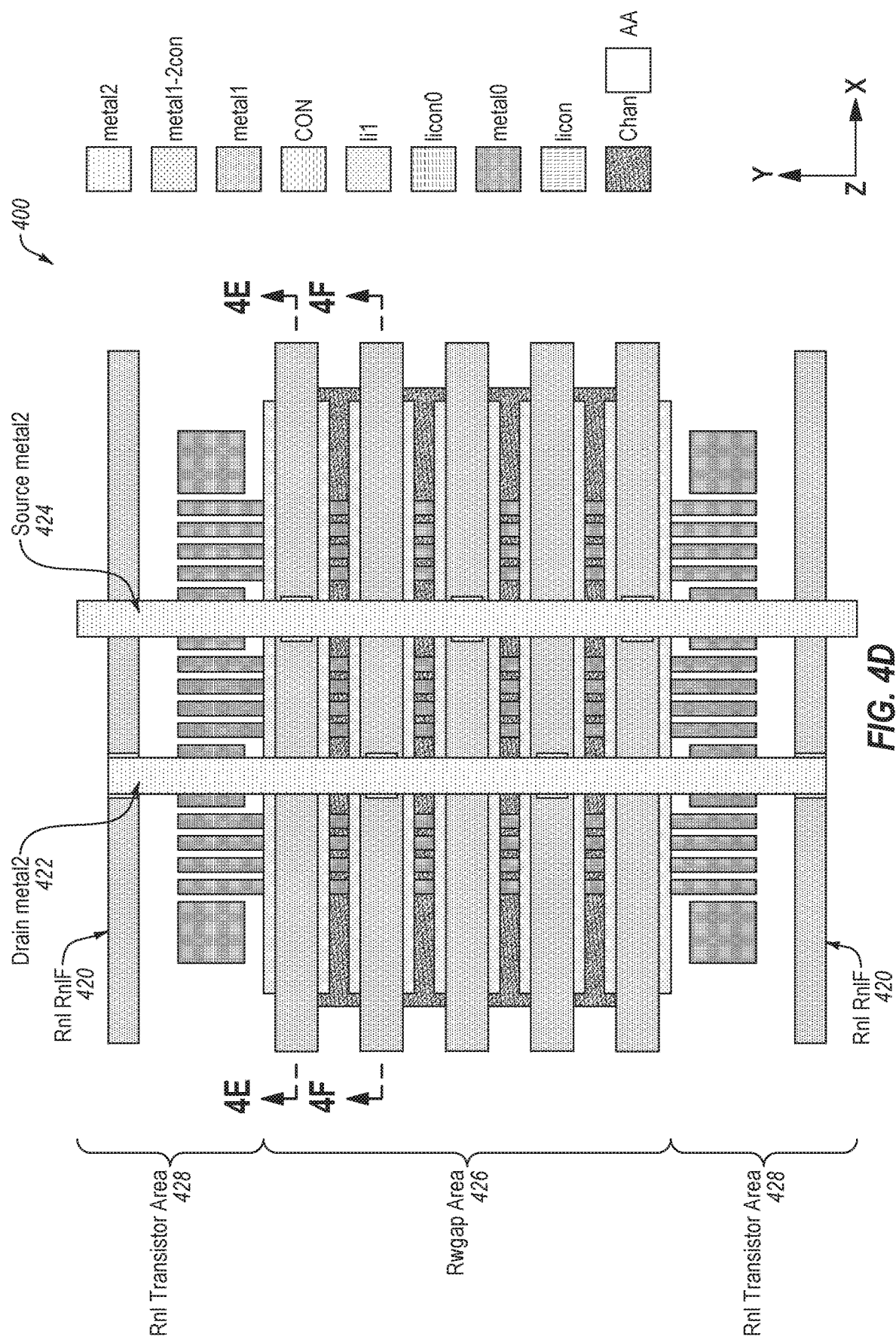
FIG. 4D is a layout diagram illustrating the example sense-amplifier driver of FIG. 4A-FIG. 4C.

FIG. 4D is a layout diagram illustrating sense-amplifier driver 400. In particular, FIG. 4D illustrates sense-amplifier driver 400 including the metal2 layer above the metal1 layer, which is above the li1 layer, which is above the metal0 layer, which is above the channel/AA layer.

Also illustrated in FIG. 4D are Rwgap area 426 and Rnl transistor area 428. Rwgap area 426 may correspond to Rwgap area 208 of FIG. 2, and Rnl transistor area 428 may correspond to Rnl transistor areas 210 of FIG. 2.

In FIG. 4C and FIG. 4D, source metal2 424 is illustrated as extending beyond Rnl RnlF 420, but, without connecting to anything. It should be understood that source metal2 424 may extend to electrically couple with another line (e.g., VSS).

Figure 4E:
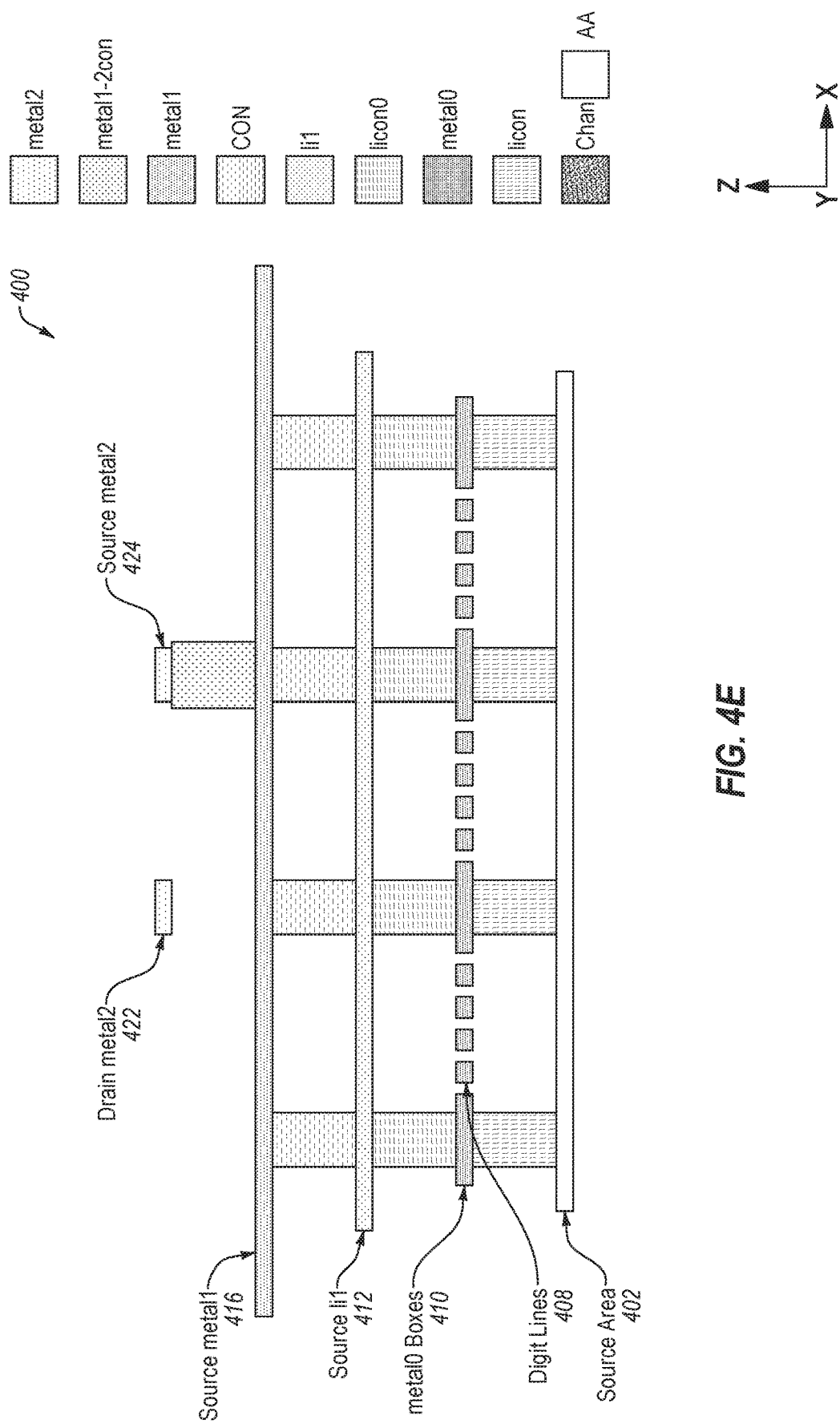
FIG. 4E-FIG. 4F are sectional diagrams illustrating additional views of the example sense-amplifier driver of FIG. 4A-FIG. 4D.
Figure 4F:
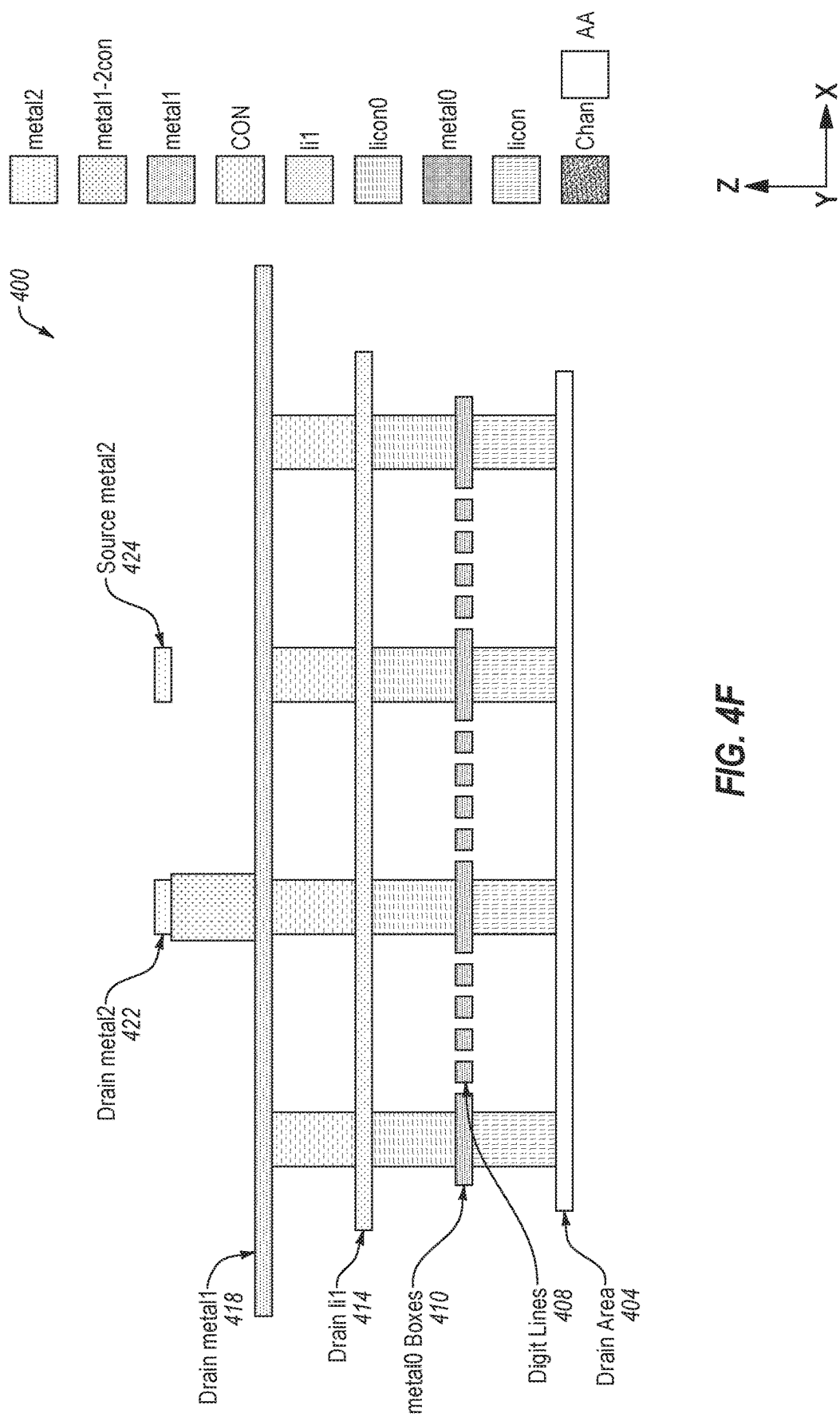

FIG. 4E and FIG. 4F are sectional diagrams illustrating additional views of sense-amplifier driver 400.

FIG. 4E illustrates source metal1 416 extending in the x-direction above source li1 412 which extends in the x-direction above one of source areas 402, which also extends in the x-direction. FIG. 4E also illustrates metal0 boxes 410 between source li1 412 and the one of source areas 402. FIG. 4E also illustrates various inter-layer contacts in the licon layer, the licon0 layer, the CON layer, and the metal1-2con layer.

FIG. 4E also illustrates digit lines 408, drain metal2 422, and source metal2 424 which extend the y-direction. As can be seen in FIG. 4E, there is an inter-layer contact between source metal1 416 and source metal2 424.

FIG. 4F illustrates drain metal1 418 extending in the x-direction above drain li1 414 which extends in the x-direction above one of drain areas 404, which also extends in the x-direction. FIG. 4F also illustrates metal0 boxes 410 between drain li1 414 and drain areas 404. FIG. 4F also illustrates various inter-layer contacts in the licon layer, the licon0 layer, the CON layer, and the metal1-2con layer.

FIG. 4F also illustrates digit lines 408, drain metal2 422, and source metal2 424 which extend in the y-direction. As can be seen in FIG. 4F, there is an inter-layer contact between drain metal1 418 and drain metal2 422.

An example sense-amplifier driver 500 of FIG. 5A-FIG. 5G may be similar, in some respects, to sense-amplifier driver 400 of FIG. 4A-FIG. 4F. For example, sense-amplifier driver 500 may be an example of an Rnl driver (e.g., an NMOS transistor configured to provide a voltage to a sense amplifier). In particular, sense-amplifier driver 500 may be an example of Rnl driver 302 of FIG. 3, which may be configured to provide voltage from a voltage line (e.g., VSS) to one or more Rnl transistors (e.g., Rnl transistor 324 and Rnl transistor 326). Further, sense-amplifier driver 500 may be an example of an Rnl driver arranged in Rnl driver area 202. Additionally, sense-amplifier driver 500 may include layers that may be similar to the layers of sense-amplifier driver 400 in that they may include similar materials, be arranged in similar orders, and, in some cases, provide for similar electrical couplings.

Additionally, sense-amplifier driver 500 of FIG. 5A-FIG. 5G may include one or more differences from sense-amplifier driver 400 of FIG. 4A-FIG. 4F. The differences between sense-amplifier driver 500 and sense-amplifier driver 400 may result in and/or provide for one or more advantages or improvements that will be discussed further below.

Figure 5A:
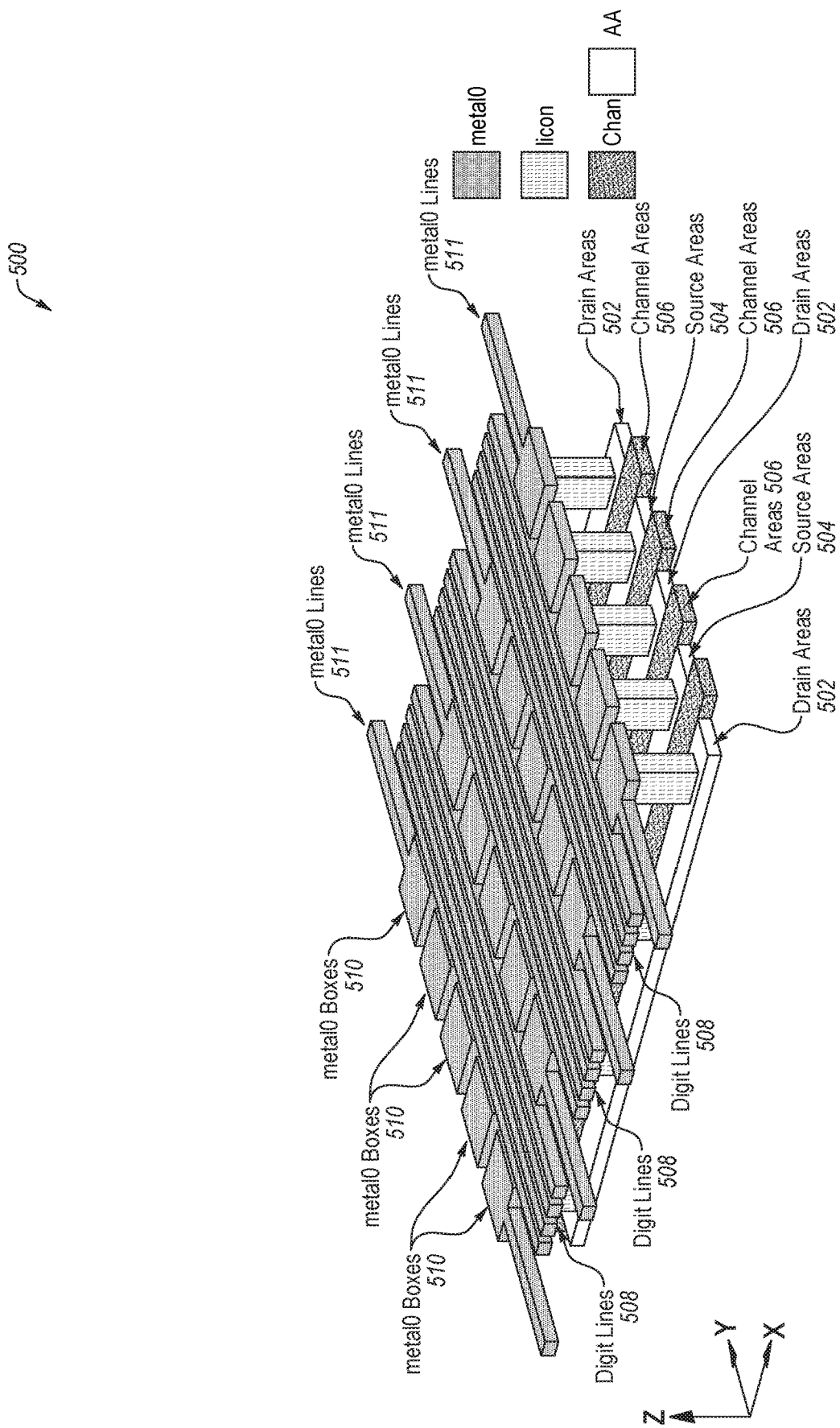
FIG. 5A-FIG. 5D are perspective views illustrating various layers of an example sense-amplifier driver in accordance with at least one embodiment of the present disclosure.

FIG. 5A-FIG. 5D are perspective views illustrating various layers of sense-amplifier driver 500 in accordance with at least one embodiment of the present disclosure. In particular, FIG. 5A illustrates sense-amplifier driver 500 including a channel/AA layer and a metal0 layer above the channel/AA layer.

The channel/AA layer of sense-amplifier driver 500, including drain areas 502, source areas 504, and channel areas 506, may be the same as or substantially similar to the channel/AA layer of sense-amplifier driver 400, including source areas 402, drain areas 404, and channel areas 406 with the exception that in the channel/AA layer of sense-amplifier driver 500, drain areas 502 are arranged outermost in the y-direction. In particular, the channel/AA layer of sense-amplifier driver 500 includes a number (in this case two) of source areas 504 interspersed between one more than the number (in this case three) of drain areas 502.

The licon layer of sense-amplifier driver 500, including the inter-layer contacts and the insulator, may be the same as or substantially similar to licon layer of sense-amplifier driver 400, including the inter-layer contacts and the insulator.

The metal0 layer of sense-amplifier driver 500, including digit lines 508 and metal0 boxes 510, may be the same as or substantially similar to the metal0 layer of sense-amplifier driver 400, including digit lines 408 and metal0 boxes 410, with the exception that the metal0 layer of sense-amplifier driver 500 may additionally include metal0 lines 511. In particular, metal0 lines 511 may extend from two or more of metal0 boxes 510. In particular, as illustrated in FIG. 5A, metal0 lines 511 may extend from two or more metal0 boxes 510 that are outermost in the y-direction. As will be described in more detail with regard to FIG. 5D, metal0 lines 511 may be configured to provide for electrical coupling for drain areas 502 e.g., to a node or line outside sense-amplifier driver 500.

Figure 5B:
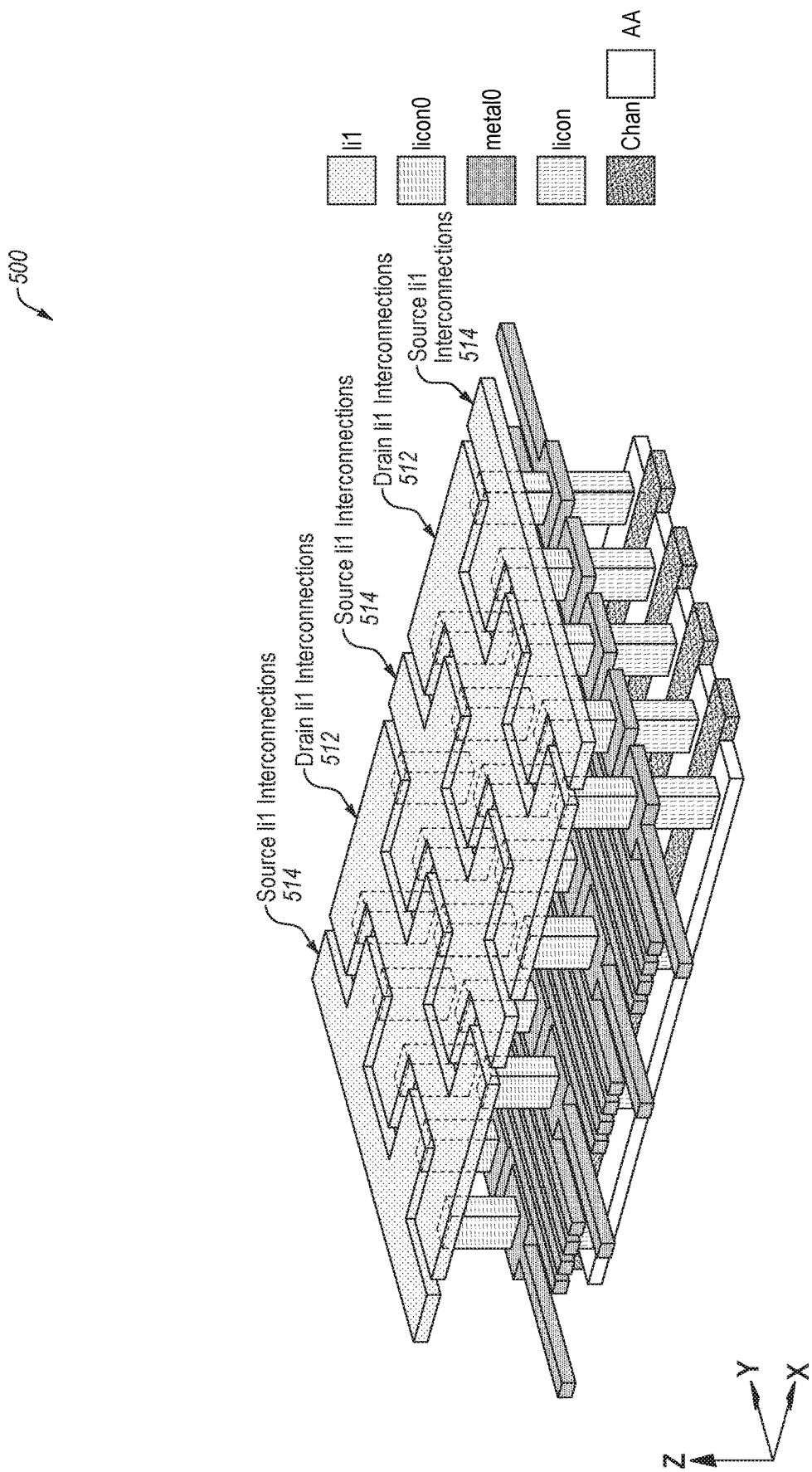

FIG. 5B illustrates sense-amplifier driver 500 including an li1 layer above the metal0 layer. The li1 layer of sense-amplifier driver 500 may be the same as or substantially similar to the li1 layer sense-amplifier driver 400 in that it may include conductive material and an insulator. However, the shape of the elements and/or lines in the li1 layer of sense-amplifier driver 500 differs from the shape of the elements and/or lines of the li1 layer of sense-amplifier driver 400. In particular, source li1 412 and drain li1 414 extend in the x-direction while drain li1 interconnections 512 and source li1 interconnections 514 extend in the x-direction and the y-direction. In the present disclosure "interconnections" may be refer to an element configured to provide for electrical connection between two or more other elements. "Interconnections" may alternatively be referred to as "interconnection wirings." In particular, drain li1 interconnections 512 and source li1 interconnections 514 include portions extending in the x-direction and portions extending in the y-direction. The portions extending in the y-direction may be configured to connect the portions extending in the x-direction.

The licon0 layer of sense-amplifier driver 500, including the inter-layer contacts and the insulator, may be the same as or substantially similar to licon0 layer of sense-amplifier driver 400, including the inter-layer contacts and the insulator.

Drain areas 502 (see FIG. 5A) may be electrically coupled to drain li1 interconnections 512 through specific inter-layer contacts (in the licon layer and the licon0 layer) and through specific metal0 boxes 510. Drain li1 interconnections 512 may be shaped and positioned such that the portions of drain li1 interconnections 512 extending in the x-direction are above the specific inter-layer contacts and the specific metal0 boxes 510. Additionally, source areas 504 may be electrical coupling to source li1 interconnections 514 through other inter-layer contacts (in the licon layer and the licon0 layer) and through other metal0 boxes 510. Source li1 interconnections 514 may be shaped and positioned such that the portions of source li1 interconnections 514 extending in the x-direction are above the other inter-layer contacts and the other metal0 boxes 510.

Various shapes, arrangements, and numbers of drain areas 502, source areas 504, drain li1 interconnections 512, source li1 interconnections 514, and portions thereof have been contemplated. FIG. 7A-FIG. 7G illustrate several examples.

Figure 5C:
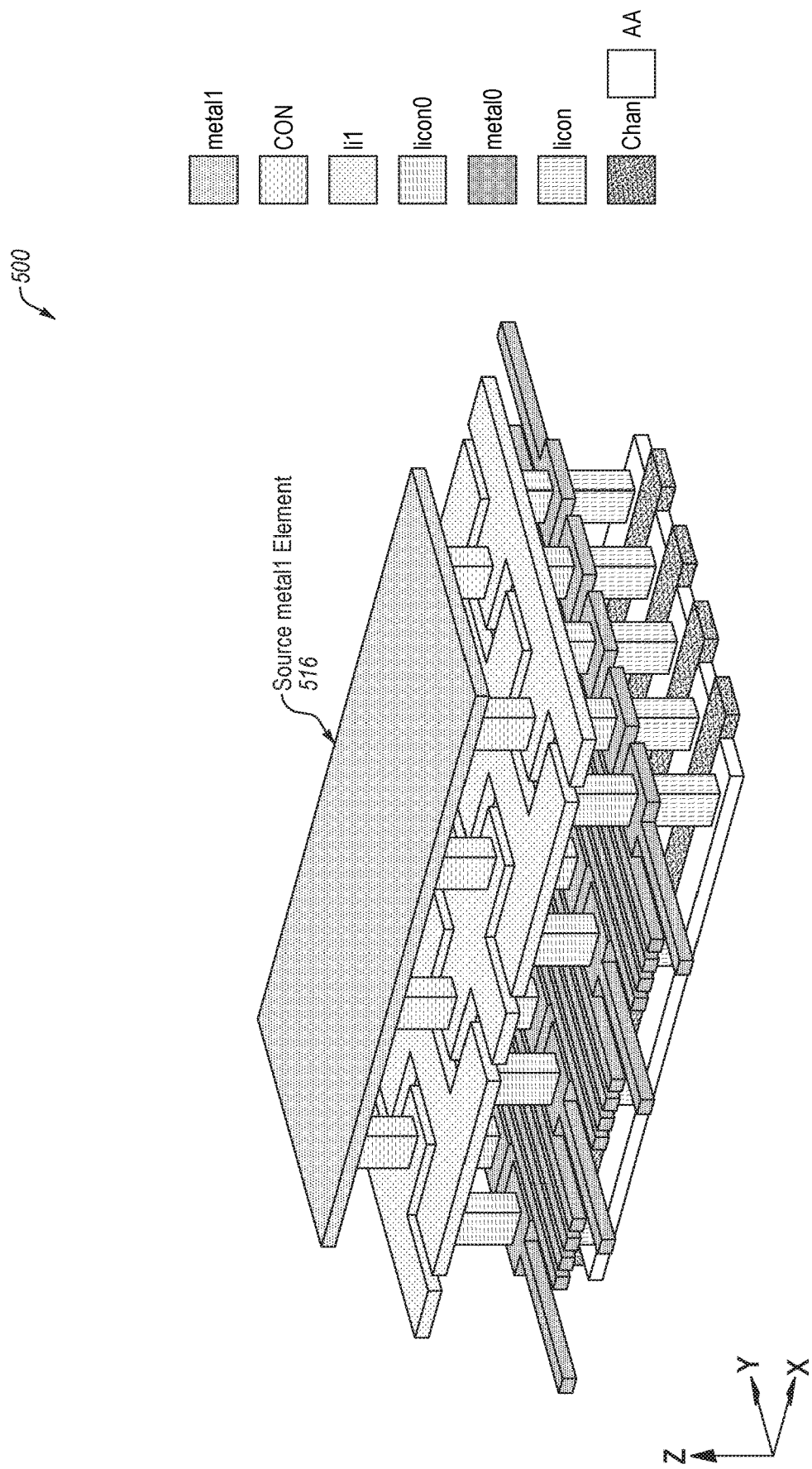

FIG. 5C illustrates sense-amplifier driver 500 including a metal1 layer above the li1 layer. The metal1 layer of sense-amplifier driver 500 may be the same as or substantially similar to the metal1 layer of sense-amplifier driver 400 in that it may include conductive material and an insulator. However, the shape of the elements and/or lines in the metal1 layer of sense-amplifier driver 500 differs from the shape of the elements and/or lines of the metal1 layer of sense-amplifier driver 400. In particular, the metal1 layer of sense-amplifier driver 500 includes source metal1 element 516 which may be characterized as a plate extending in the x-direction and the y-direction. Source metal1 element 516 may be arranged to be above one or more (or even all) of source li1 interconnections 514 e.g., such that source li1 interconnections 514 (see FIG. 5B) can be electrically coupled to source metal1 element 516 through inter-layer contacts. In some embodiments, source metal1 element 516 may be arranged such that it is above one or more (or even all) of the portions of source li1 interconnections 514 that extend in the x-direction.

One advantage of sense-amplifier driver 500 over sense-amplifier driver 400 is that in sense-amplifier driver 500 source metal1 element 516 is larger than source metal1 416. Source metal1 element 516 has a lower electrical impedance than source metal1 416 because source metal1 element 516 is larger than source metal1 416. Source metal1 element 516 can be larger than source metal1 416 because there are no "drain" elements and/or lines (i.e., elements and/or lines that are electrically coupled to drain areas 502) in the metal1 layer of sense-amplifier driver 500.

Another advantage of sense-amplifier driver 500 over sense-amplifier driver 400 is that sense-amplifier driver 500 allows for larger and/or more inter-layer contacts between source li1 interconnections 514 and source metal1 element 516. As can be seen in FIG. 4B, the size and/or spacing of the inter-layer contacts between drain li1 414 and drain metal1 418 is limited by the dimensions of drain li1 414 and drain metal1 418, which in turn are limited by the presence of source li1 412 and source metal1 416 interspersed between drain li1 414 and drain metal1 418. Further, as can be seen in FIG. 4B, the size and/or spacing of inter-layer contacts in the CON layer is limited by inter-layer contacts connecting drain li1 414 to drain metal1 418 and source li1 412 to source metal1 416.

In contrast, as can be seen in FIG. 5C, the size and/or spacing of the inter-layer contacts between source li1 interconnections 514 and source metal1 element 516 is not limited in the same ways. Because there are no "drain" elements and/or lines in the metal1 layer of sense-amplifier driver 500 there is no need for inter-layer contacts in the CON layer from drain li1 interconnections 512. Thus, there are no "drain" inter-layer contacts in the CON layer. This allows the inter-layer contacts between source li1 interconnections 514 and source metal1 element 516 to be larger and/or more tightly spaced (e.g., allowing for more inter-layer contacts). Allowing for more and/or larger inter-layer contacts allows for lower electrical impedance between source metal1 element 516 and source li1 interconnections 514 than is between source li1 412 and source metal1 416.

Figure 5D:
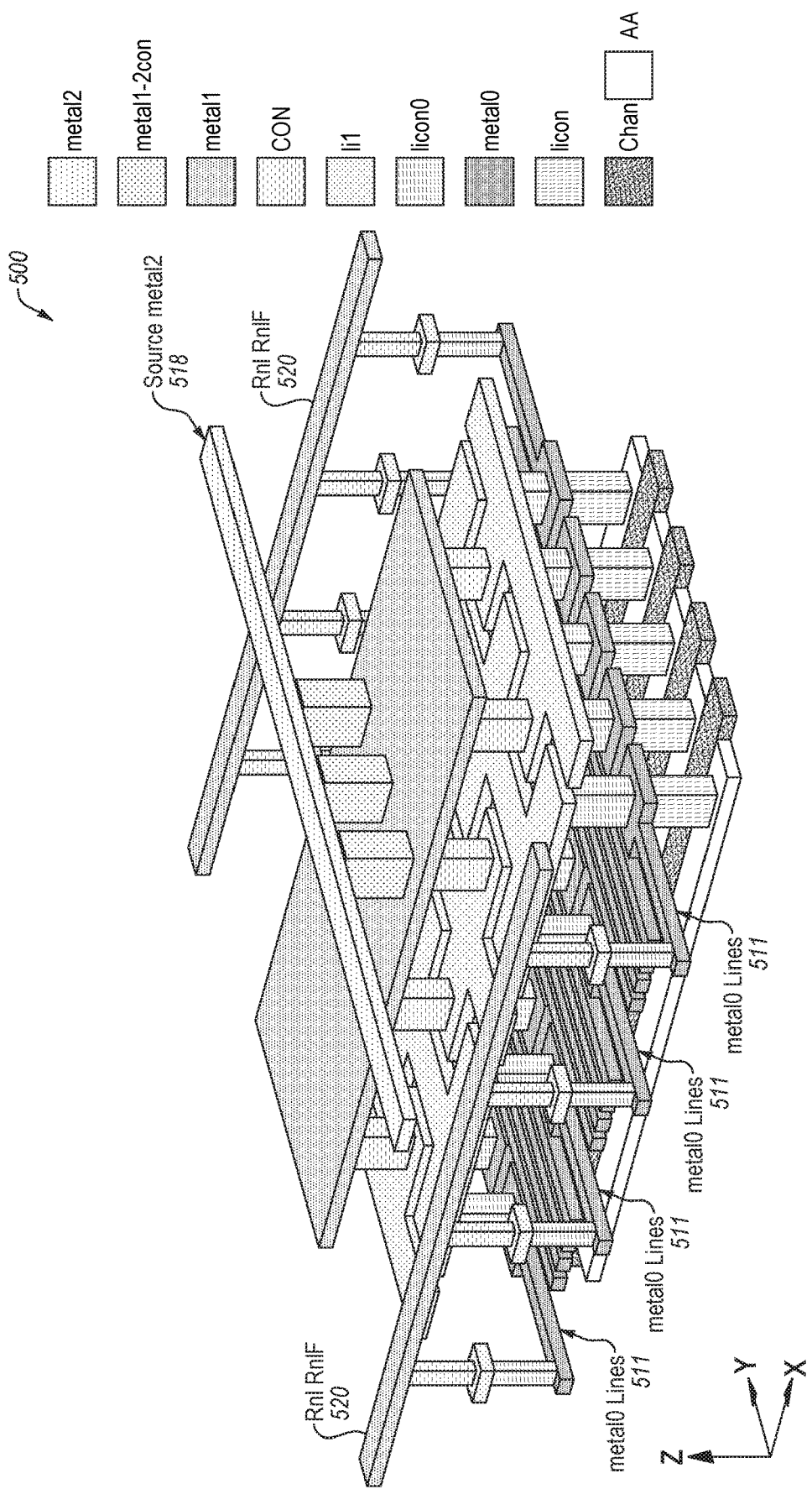

FIG. 5D illustrates sense-amplifier driver 500 including a metal2 layer above the metal1 layer. Additionally, FIG. 5D illustrates Rnl RnlF 520 which may be part of a sense amplifier.

Rnl RnlF 520 may be the same as or similar to Rnl RnlF 420 (see FIG. 4C). In particular, Rnl RnlF 520 may be electrical electrically coupled to a source of an Rnl transistor (e.g., arranged in Rnl transistor areas 210).

In contrast to sense-amplifier driver 400, sense-amplifier driver 500 does not include a drain metal2 422 to provide for electrical coupling between drain areas 502 to Rnl RnlF 520. Rather, sense-amplifier driver 500 includes metal0 lines 511 to provide for electrical coupling between drain areas 502 and Rnl RnlF 520. As is illustrated in FIG. 5D, sense-amplifier driver 500 may include inter-layer contacts between metal0 lines 511 and Rnl RnlF 520. Additionally, sense-amplifier driver 500 may include metal boxes in the li1 layer to provide for electrical coupling between the inter-layer contacts electrical coupling metal0 lines 511 to Rnl RnlF 520. The number and/or size of metal0 lines 511 may provide for lower electrical impedance than is provided by drain metal2 422.

The metal2 layer of sense-amplifier driver 500 includes source metal2 518 which may be a line that may extend beyond sense-amplifier driver 500 to provide for electrical coupling to source metal1 element 516. For example, source metal2 518 may be the same as or substantially similar to source metal2 424. Source metal2 518 may be electrically coupled to a voltage line, e.g., VSS.

Another advantage of sense-amplifier driver 500 over sense-amplifier driver 400 may be that sense-amplifier driver 500 may include more and/or larger inter-layer contacts between source metal1 element 516 and source metal2 518 than the inter-layer contacts between source metal1 416 and source metal2 424. This may be because the source metal1 element 516 may be larger than source metal1 416. Having more and/or larger inter-layer contacts between source metal1 element 516 and source metal2 518 may result in lower electrical impedance between source metal1 element 516 and source metal2 518 than between source metal1 416 and source metal2 424.

Any or all of source metal1 element 516, the number of "source" inter-layer contacts in the CON layer, and the size of the "source" inter-layer contacts in the CON layer may allow sense-amplifier driver 500 to have lower electrical impedance (in particular between the voltage line (e.g., VSS) and the rest of sense-amplifier driver 500) than sense-amplifier driver 400. Additionally, metal0 lines 511 may allow sense-amplifier driver 500 to have lower electrical impedance (in particular between a node (e.g., Rnl RnlF 520) and the rest of sense-amplifier driver 500) than sense-amplifier driver 400.

Figure 5E:
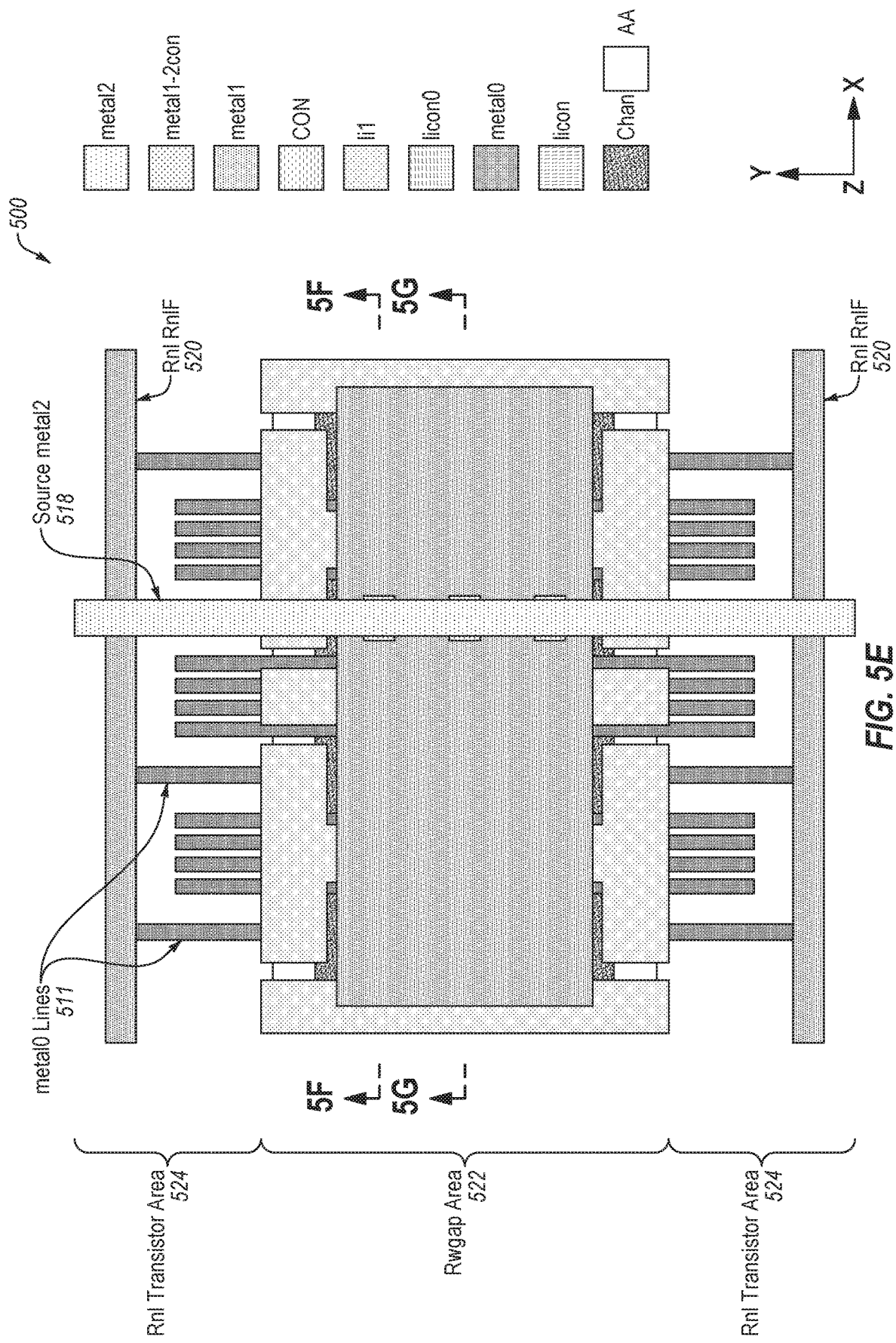
FIG. 5E is a layout diagram illustrating the example sense-amplifier driver of FIG. 5A-FIG. 5D in accordance with at least one embodiment of the present disclosure.

FIG. 5E is a layout diagram illustrating sense-amplifier driver 500 in accordance with at least one embodiment of the present disclosure. In particular, FIG. 5E illustrates sense-amplifier driver 500 including the metal2 layer above the metal1 layer, which is above the li1 layer, which is above the metal0 layer, which is above the channel/AA layer.

Also illustrated in FIG. 5E are Rwgap area 522 and Rnl transistor area 524. Rwgap area 522 may correspond to Rwgap area 208 of FIG. 2, and Rnl transistor area 524 may correspond to Rnl transistor areas 210 of FIG. 2.

Figure 5F:
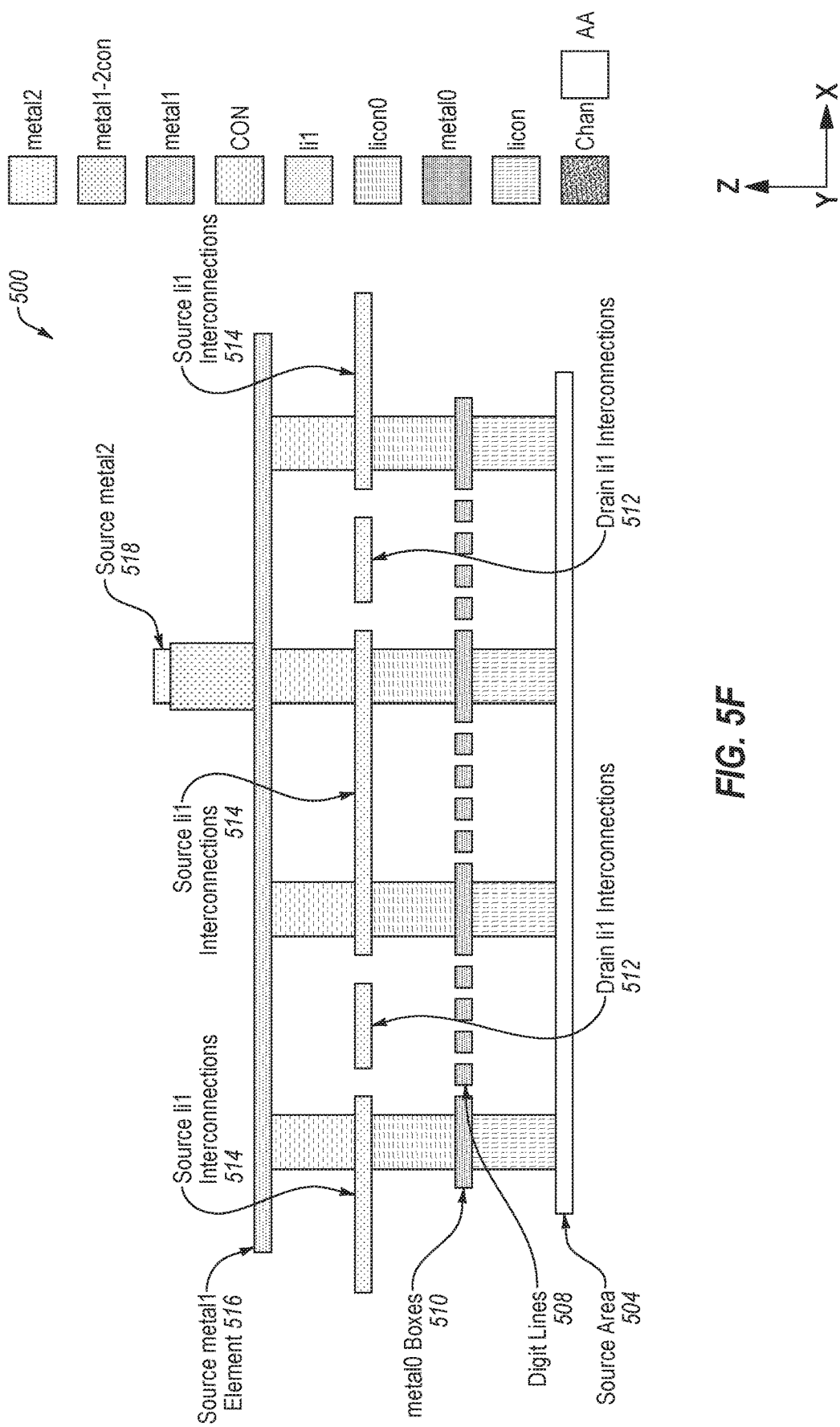
FIG. 5F-FIG. 5G are sectional diagrams illustrating additional views of the example sense-amplifier driver of FIG. 5A-FIG. 5E in accordance with at least one embodiment of the present disclosure.
Figure 5G:
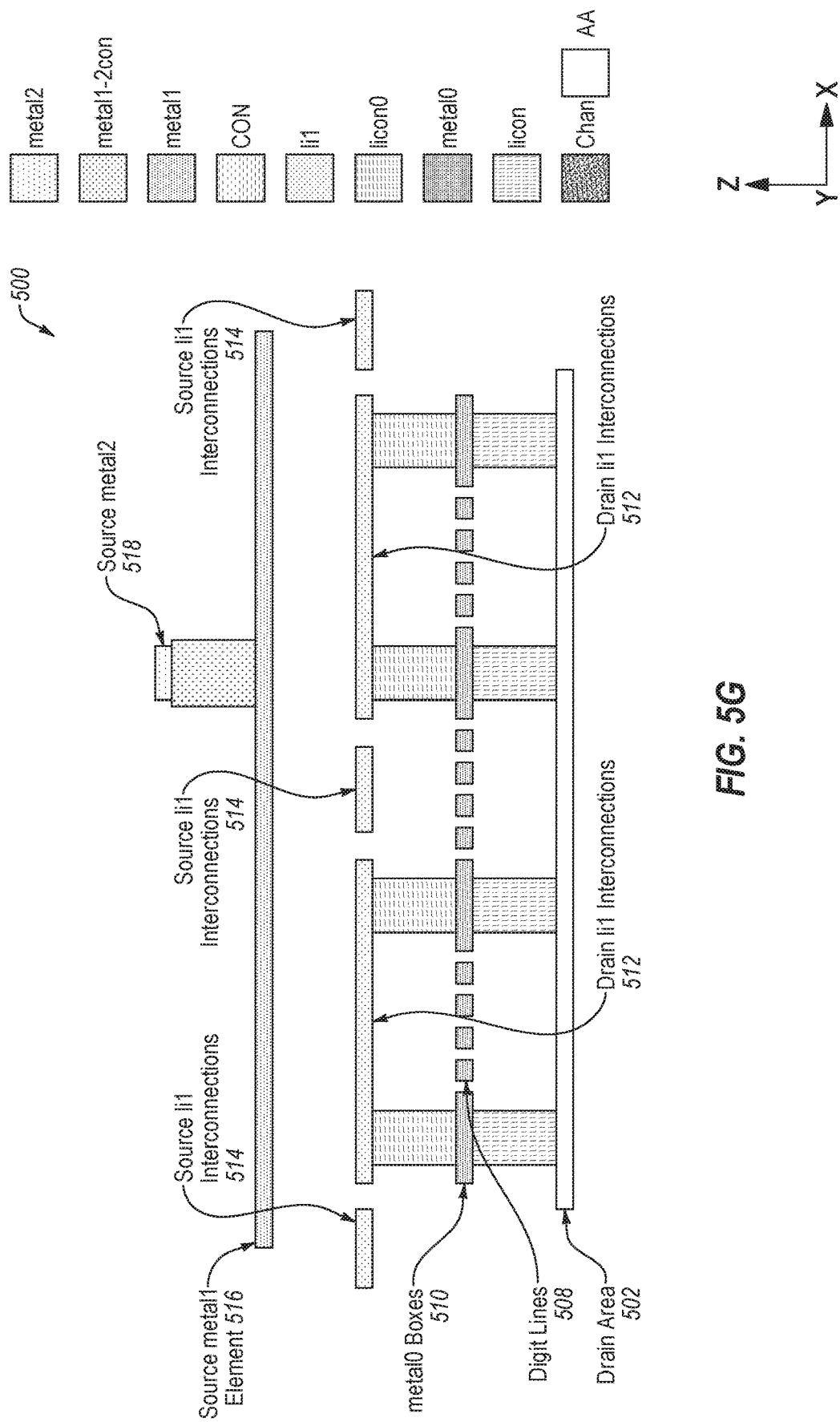

FIG. 5F and FIG. 5G are sectional diagrams illustrating additional views of sense-amplifier driver 500 in accordance with at least one embodiment of the present disclosure. FIG. 5F illustrates source metal1 element 516 extending in the x-direction above portions of source li1 interconnections 514 which extend in the x-direction above one of source areas 504, which also extends in the x-direction. FIG. 5F also illustrates metal0 boxes 510 between source li1 interconnections 514 and source areas 504. FIG. 5F also illustrates various inter-layer contacts in the licon layer, the licon0 layer, the CON layer, and the metal1-2con layer. FIG. 5F also illustrates portions of drain li1 interconnections 512 interspersed between the portions of source li1 interconnections 514.

FIG. 5F also illustrates digit lines 508 and source metal2 518 which extend the y-direction. As can be seen in FIG. 5F, there is an inter-layer contact between source metal1 element 516 and source metal2 518.

FIG. 5G illustrates portions of drain li1 interconnections 512 which extend in the x-direction above one of drain areas 502, which also extends in the x-direction. FIG. 5G also illustrates metal0 boxes 510 between drain li1 interconnections 512 and drain areas 502. FIG. 5G also illustrates various inter-layer contacts in the licon layer, the licon0 layer, and the metal1-2con layer.

FIG. 5G also illustrates portions of source li1 interconnections 514 interspersed between the portions of drain li1 interconnections 512. FIG. 5G also illustrates source metal1 element 516 which extends above, but is not electrically coupled to drain li1 interconnections 512. FIG. 5G also illustrates digit lines 508 and source metal2 518 which extend the y-direction.

An example sense-amplifier driver 600 of FIG. 6A-FIG. 6G may be an example of a PSA driver (e.g., a PMOS transistor configured to provide a voltage to a sense amplifier). In particular, sense-amplifier driver 600 may be an example of PSA driver 312 of FIG. 3, which may be configured to provide voltage from a voltage line (e.g., VARY) to one or more PSA transistors (e.g., PSA transistor 328 and PSA transistor 330). Further, sense-amplifier driver 600 may be an example of a PSA driver arranged in PSA driver area 204.

Sense-amplifier driver 600 may be similar to sense-amplifier driver 500 in many respects. For example, sense-amplifier driver 600 may include a transistor configured to provide a voltage to a sense amplifier. Further, sense-amplifier driver 600 may include source areas, drain areas, and channel areas, and one or more metal layers configured to connect the source areas, drain areas, and gate areas (not illustrated) above channel areas to other nodes and/or lines. As such, sense-amplifier driver 600 may include and/or provide for advantages over other PSA drivers that are similar to the advantages described with regard to sense-amplifier driver 500.

One difference between sense-amplifier driver 600 and sense-amplifier driver 500 may be that Rnl driver area 202 (which may include sense-amplifier driver 500) may be arranged adjacent to Rnl transistor areas 210 whereas PSA driver area 204 (which may include sense-amplifier driver 600) may be separated from PSA transistor areas 212 by Rnl transistor areas 210. Sense-amplifier driver 500 may be able to provide for electrical coupling between a sense-amplifier transistor and sense-amplifier driver 500 through metal0 lines 511. In contrast, because Rnl transistor areas 210 may be between PSA driver area 204 and PSA transistor areas 212, sense-amplifier driver 600 may not be able to provide for electrical coupling in the metal0 layer. However, sense-amplifier driver 600 may still benefit from improvements of sense-amplifier driver 500 over sense-amplifier driver 400.

Figure 6A:
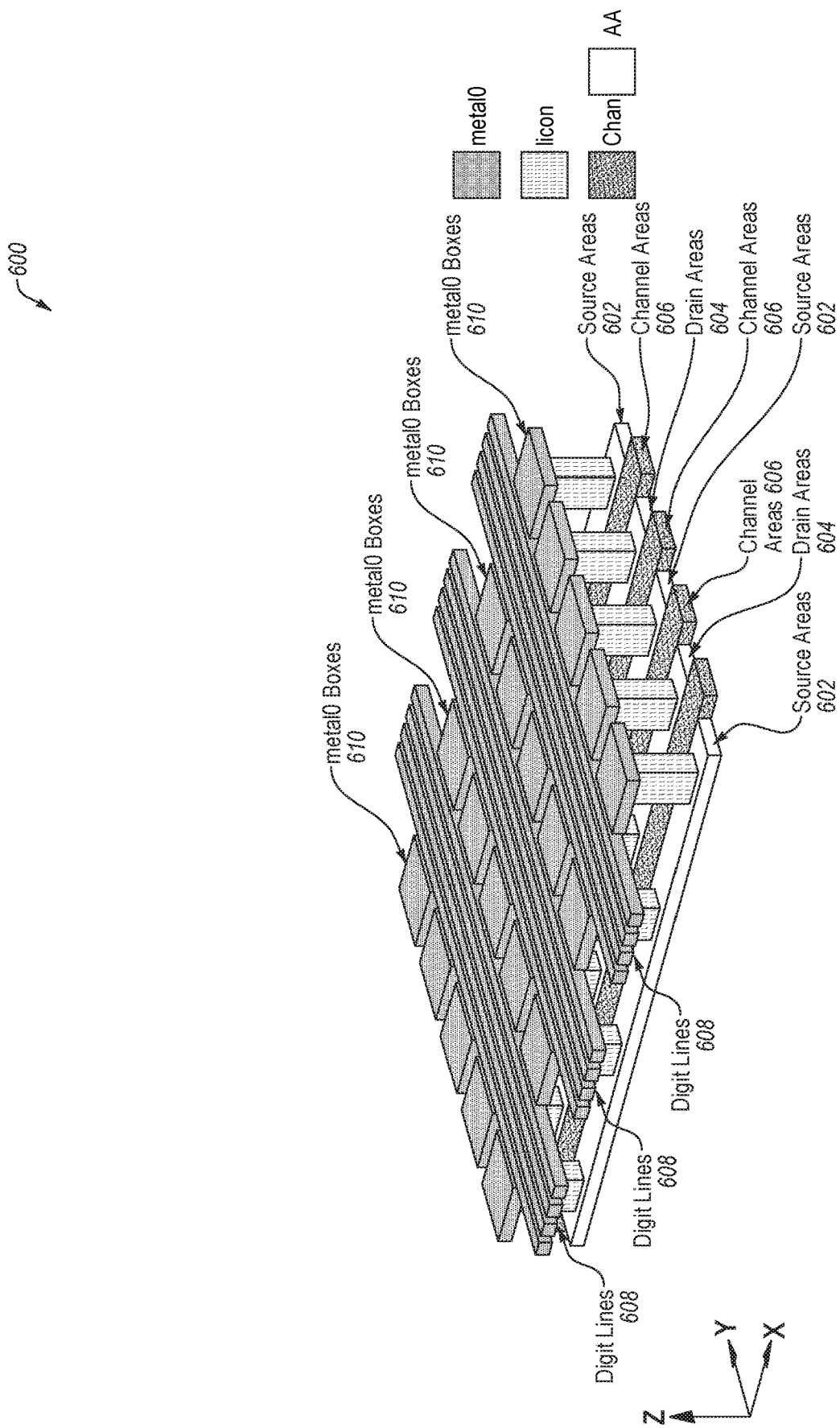
FIG. 6A-FIG. 6D are perspective views illustrating various layers of another example sense-amplifier driver in accordance with at least one embodiment of the present disclosure.

FIG. 6A-FIG. 6D are perspective views illustrating various layers of sense-amplifier driver 600 in accordance with at least one embodiment of the present disclosure. In particular, FIG. 6A illustrates sense-amplifier driver 600 including a channel/AA layer and a metal0 layer above the channel/AA layer.

The channel/AA layer of sense-amplifier driver 600, including source areas 602, drain areas 604, and channel areas 606, may be the same as or substantially similar to the channel/AA layer of sense-amplifier driver 400, including source areas 402, drain areas 404, and channel areas 406. The licon layer of sense-amplifier driver 600, including the inter-layer contacts and the insulator, may be the same as or substantially similar to licon layer of sense-amplifier driver 400, including the inter-layer contacts and the insulator. The metal0 layer of sense-amplifier driver 600, including digit lines 608 and metal0 boxes 610, may be the same as or substantially similar to the metal0 layer of sense-amplifier driver 400, including digit lines 408 and metal0 boxes 410.

Figure 6B:
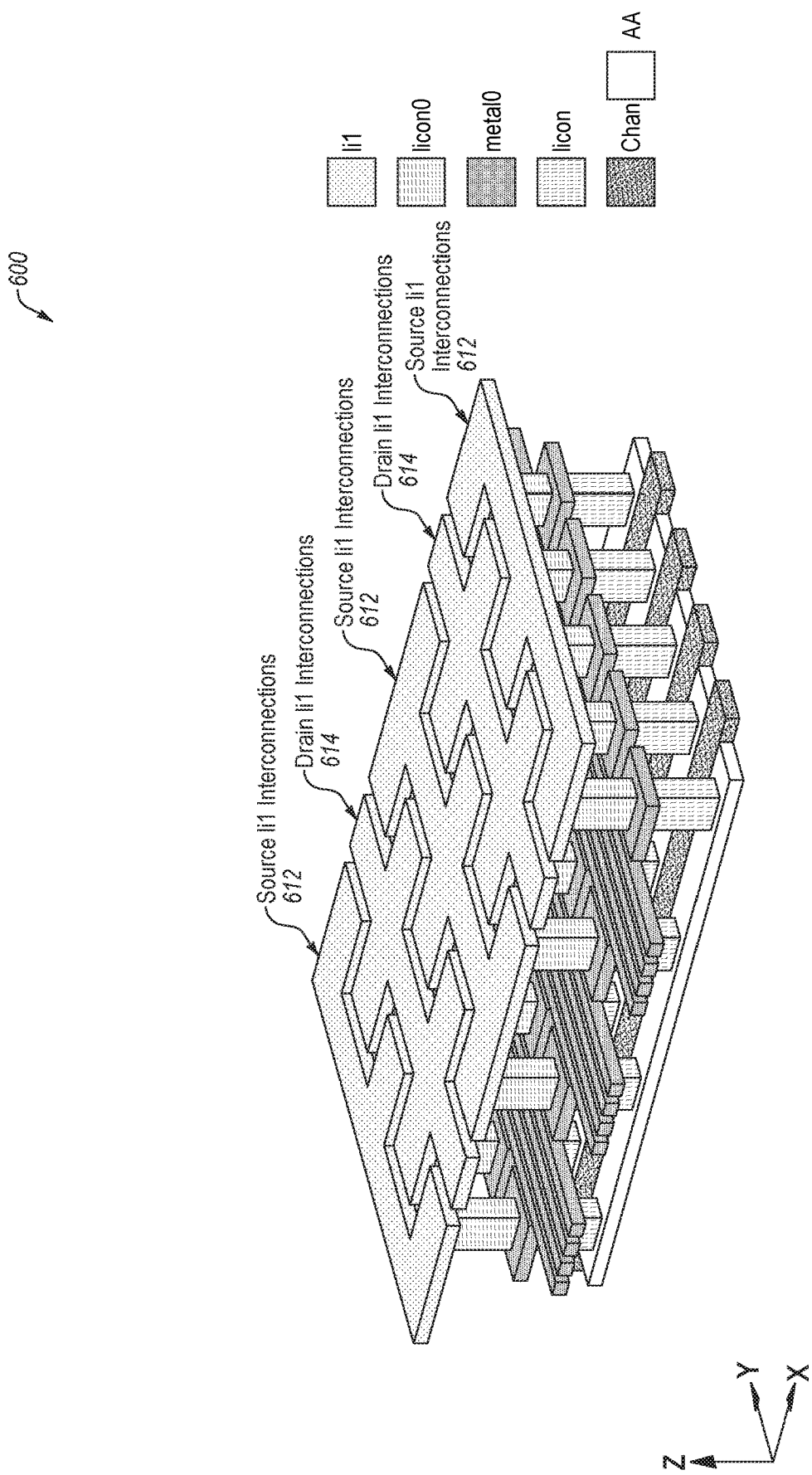

FIG. 6B illustrates sense-amplifier driver 600 including a li1 layer above the metal0 layer. The li1 layer of sense-amplifier driver 600 may be the same as or substantially similar to the li1 layer sense-amplifier driver 500 in that it may include conductive material and an insulator. Further, sense-amplifier driver 600 may be similar to sense-amplifier driver 500 in that sense-amplifier driver 600 may include source li1 interconnections 612 and drain li1 interconnections 614 which include portions extending in the x-direction and portions extending in the y-direction (similar to drain li1 interconnections 512 and source li1 interconnections 514). However, because the sense-amplifier driver 500 includes drain areas 502 arranged outermost in the y-direction, and sense-amplifier driver 600 includes source areas 602 arranged outermost in the y-direction, in some embodiments, the shapes of drain li1 interconnections 512 and source li1 interconnections 612 may be similar, but, not the same. Likewise, the shapes of source li1 interconnections 514 and drain li1 interconnections 614 may be similar, but not the same.

The licon0 layer of sense-amplifier driver 600, including the inter-layer contacts and the insulator, may be the same as or substantially similar to licon0 layer of sense-amplifier driver 400, including the inter-layer contacts and the insulator.

Source areas 602 may be electrically coupled to source li1 interconnections 612 through specific inter-layer contacts (in the licon layer and the licon0 layer) and through specific metal0 boxes 610. Source li1 interconnections 612 may be shaped and positioned such that the portions of source li1 interconnections 612 extending in the x-direction are above the specific inter-layer contacts and the specific metal0 boxes 610. Additionally, drain areas 604 may be electrically coupled to drain li1 interconnections 614 through other inter-layer contacts (in the licon layer and the licon0 layer) and through other metal0 boxes 610. Drain li1 interconnections 614 may be shaped and positioned such that the portions of drain li1 interconnections 614 extending in the x-direction are above the other inter-layer contacts and the other metal0 boxes 610.

Various shapes, arrangements, and numbers of source areas 602, drain areas 604, source li1 interconnections 612, drain li1 interconnections 614, and portions thereof have been contemplated. FIG. 7A-FIG. 7G illustrate several examples.

Figure 6C:
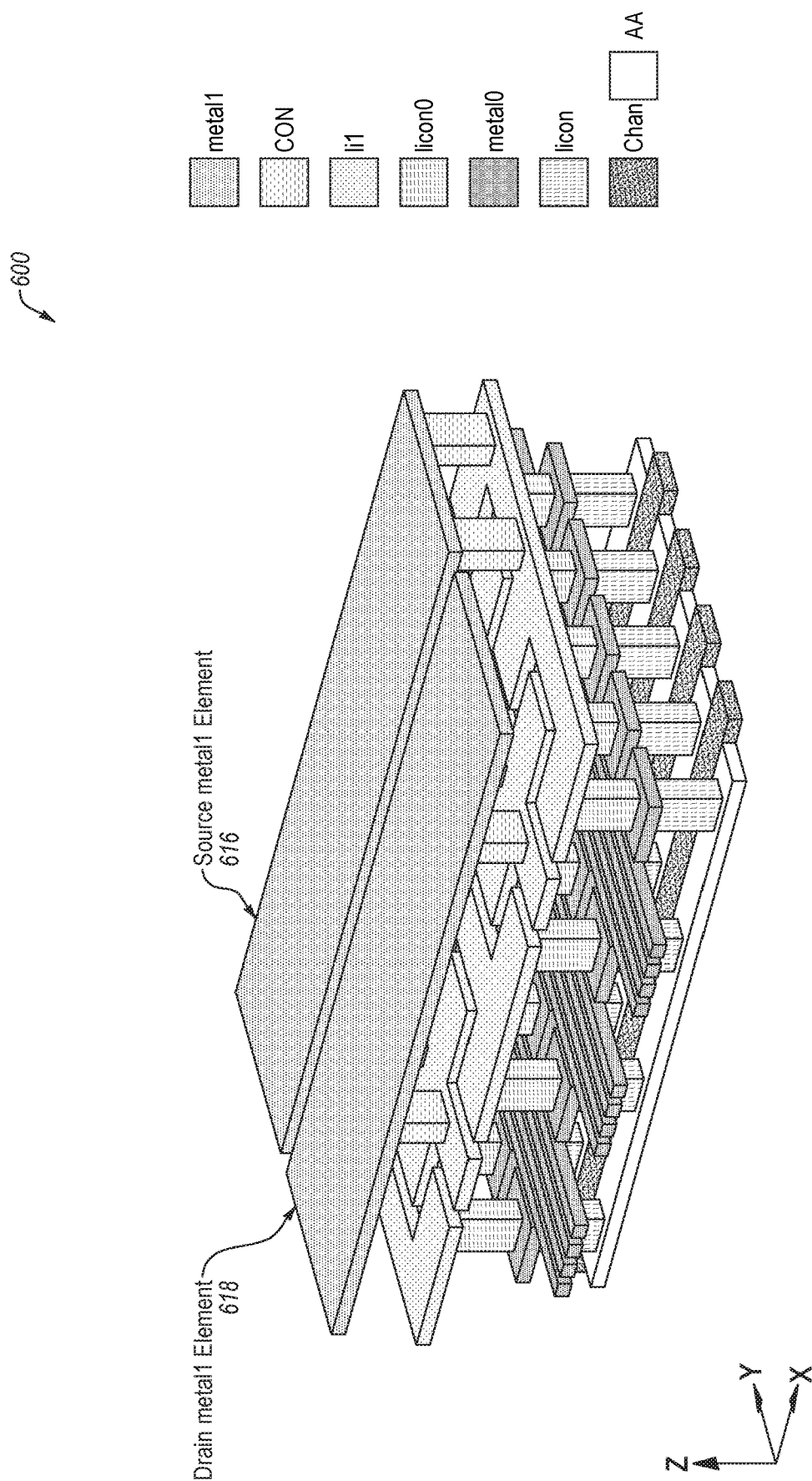

FIG. 6C illustrates sense-amplifier driver 600 including a metal1 layer above the li1 layer. The metal1 layer of sense-amplifier driver 600 may be the same as or substantially similar to the metal1 layer of sense-amplifier driver 400 and sense-amplifier driver 500 in that it may include conductive material and an insulator. However, the shape of the elements and/or lines in the metal1 layer of sense-amplifier driver 600 differs from the shape of the elements and/or lines of the metal1 layer of sense-amplifier driver 400 and sense-amplifier driver 500. In particular, the metal1 layer of sense-amplifier driver 600 includes source metal1 element 616 and drain metal1 element 618 which may be characterized as plates extending in the x-direction and the y-direction. Source metal1 element 616 may be arranged to be above one or more source li1 interconnections 612 e.g., such that source li1 interconnections 612 can be electrically coupled to source metal1 element 616 through inter-layer contacts. Drain metal1 element 618 may be arranged to be above one or more drain li1 interconnections 614 e.g., such that drain li1 interconnections 614 can be electrically coupled to drain metal1 element 618 through inter-layer contacts.

Sense-amplifier driver 600 may provide advantages over a PSA driver arranged similarly to sense-amplifier driver 400 that are similar to the advantages of sense-amplifier driver 500 over sense-amplifier driver 400. In particular, source metal1 element 616 is larger than source metal1 416 which may allow sense-amplifier driver 600 to provide for lower electrical impedance than possible in a PSA driver arranged similarly to sense-amplifier driver 400. Additionally, because there are no "drain" inter-layer contacts under source metal1 element 616, the interlayer contacts between source metal1 element 616 and source li1 interconnections 612 can be larger and/or more numerous, which may also provide for lower electrical impedance than possible in a PSA driver arranged similarly to sense-amplifier driver 400.

Additionally, "drain" elements and/or lines may exhibit similar advantages. In particular, drain metal1 element 618 is larger than drain metal1 418 which may allow sense-amplifier driver 600 to provide lower electrical impedance than possible in a PSA driver arranged similarly to sense-amplifier driver 400. Additionally, because there are no "source" inter-layer contacts under drain metal1 element 618, the interlayer contacts between drain metal1 element 618 and drain li1 interconnections 614 can be larger and/or more numerous, which may also provide for lower electrical impedance than possible in a PSA driver arranged similarly to sense-amplifier driver 400.

Figure 6D:
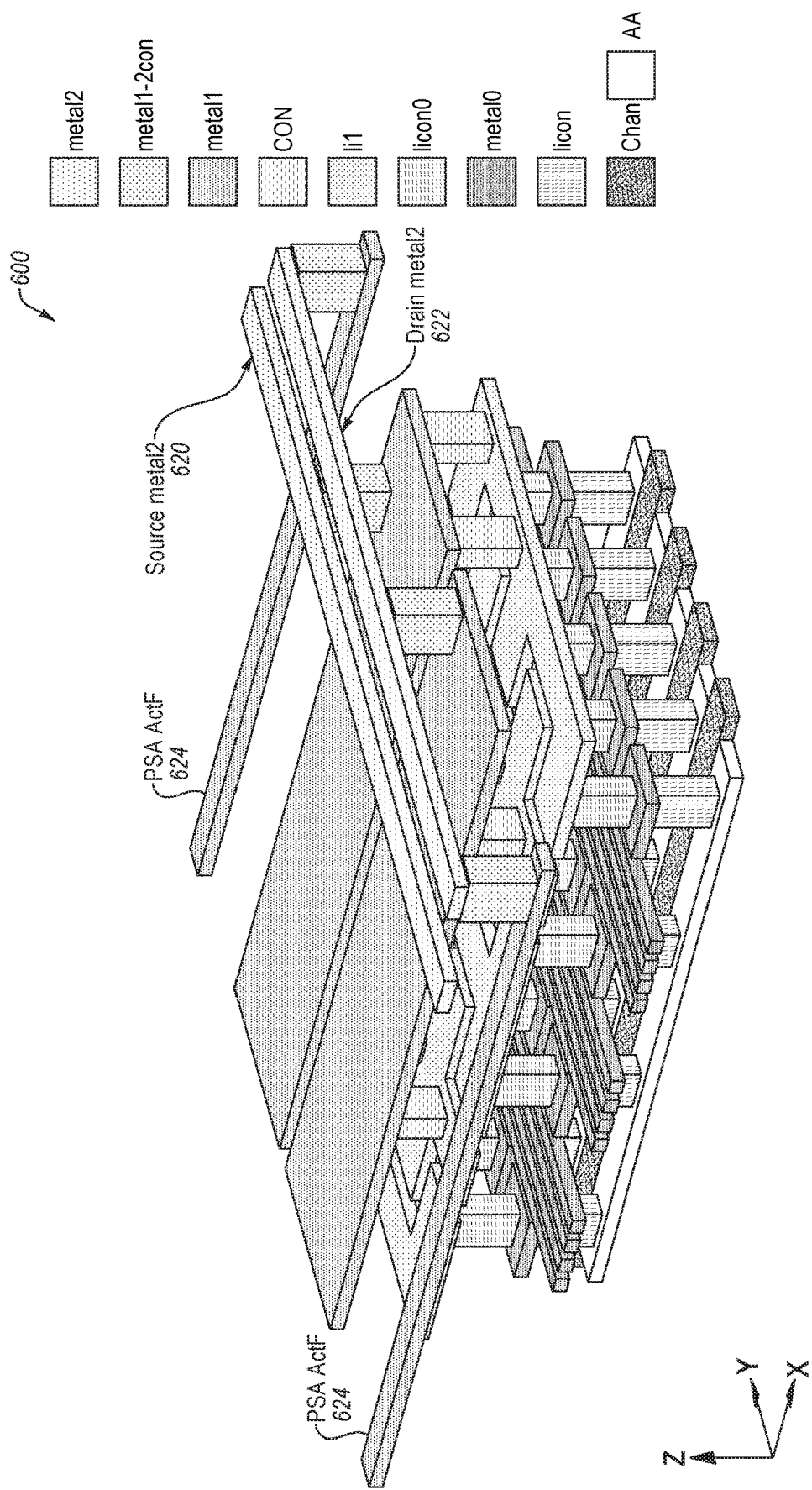

FIG. 6D illustrates sense-amplifier driver 600 including a metal2 layer above the metal1 layer. Additionally, FIG. 6D illustrates PSA ActF 624 which may be part of a sense amplifier.

PSA ActF 624 may be the similar to and/or perform a similar function as Rnl RnlF 420. In particular, PSA ActF 624 may be electrically coupled to a PSA transistor (e.g., arranged in PSA transistor areas 212). PSA ActF 624 may be positioned farther from sense-amplifier driver 600 than is illustrated in FIG. 6D. In particular, there may be an Rnl transistor area 626 (not illustrated in FIG. 6D) between sense-amplifier driver 600 and PSA ActF 624.

The metal2 layer of sense-amplifier driver 600 may include source metal2 620 which may provide for electrical coupling between PSA ActF 624 and source metal1 element 616. Source metal2 620 may be the same as or substantially similar to drain metal2 422 of sense-amplifier driver 400.

The metal2 layer of sense-amplifier driver 600 may include drain metal2 622 which may be a line that may extend beyond sense-amplifier driver 600 to provide for electrical coupling to drain metal1 element 618. For example, drain metal2 622 may be the same as or substantially similar to source metal2 424. Drain metal2 622 may be electrically coupled to a voltage line, e.g., VARY.

Another advantage that sense-amplifier driver 600 may provide over a PSA driver arranged similarly to sense-amplifier driver 400 is that drain metal2 622 may be connected to drain metal1 element 618 through larger and/or more inter-layer contacts than are included in a PSA driver arranged similarly to sense-amplifier driver 400. This may provide for lower electrical impedance between drain metal2 622 and drain metal1 element 618 when compared with a PSA driver arranged similarly to sense-amplifier driver 400.

Similarly, source metal2 620 may be connected to source metal1 element 616 through larger and/or more inter-layer contacts than are included in a PSA driver arranged similarly to sense-amplifier driver 400. This may lower electrical impedance between source metal2 620 and source metal1 element 616 when compared with a PSA driver arranged similarly to sense-amplifier driver 400.

Figure 6E:
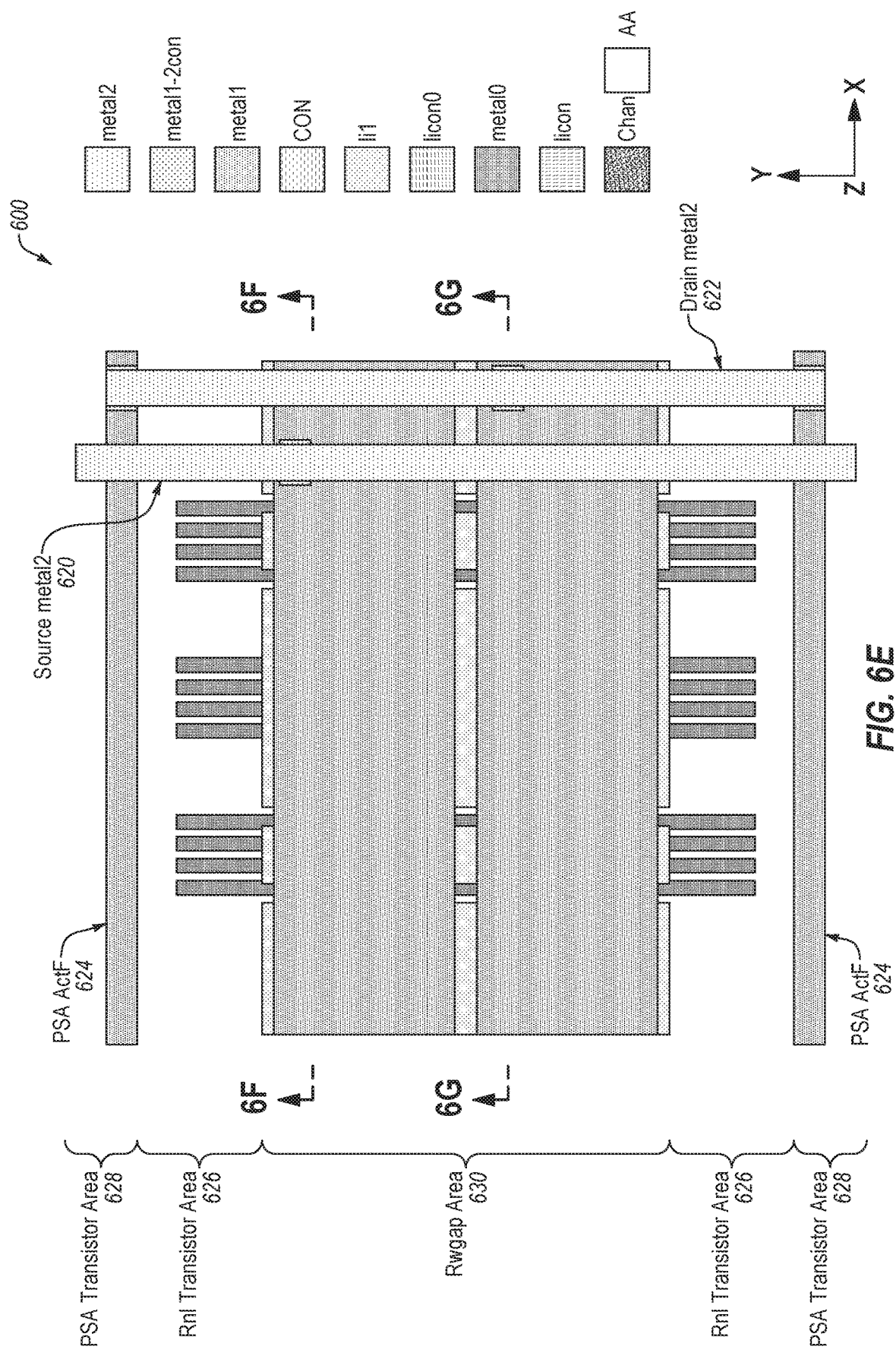
FIG. 6E is a layout diagram illustrating the example sense-amplifier driver of FIG. 6A-FIG. 6D in accordance with at least one embodiment of the present disclosure.

FIG. 6E is a layout diagram illustrating sense-amplifier driver 600 in accordance with at least one embodiment of the present disclosure. In particular, FIG. 6E illustrates sense-amplifier driver 600 including the metal2 layer above the metal1 layer, which is above the li1 layer, which is above the metal0 layer, which is above the channel/AA layer.

Also illustrated in FIG. 6E are Rwgap area 630, Rnl transistor area 626, and PSA transistor area 628. Rwgap area 630 may correspond to sense amplifier areas 214 of FIG. 2. Rnl transistor area 626 may correspond to Rnl transistor areas 210 of FIG. 2. PSA transistor area 628 may correspond to PSA transistor areas 212 of FIG. 2.

Figure 6F:
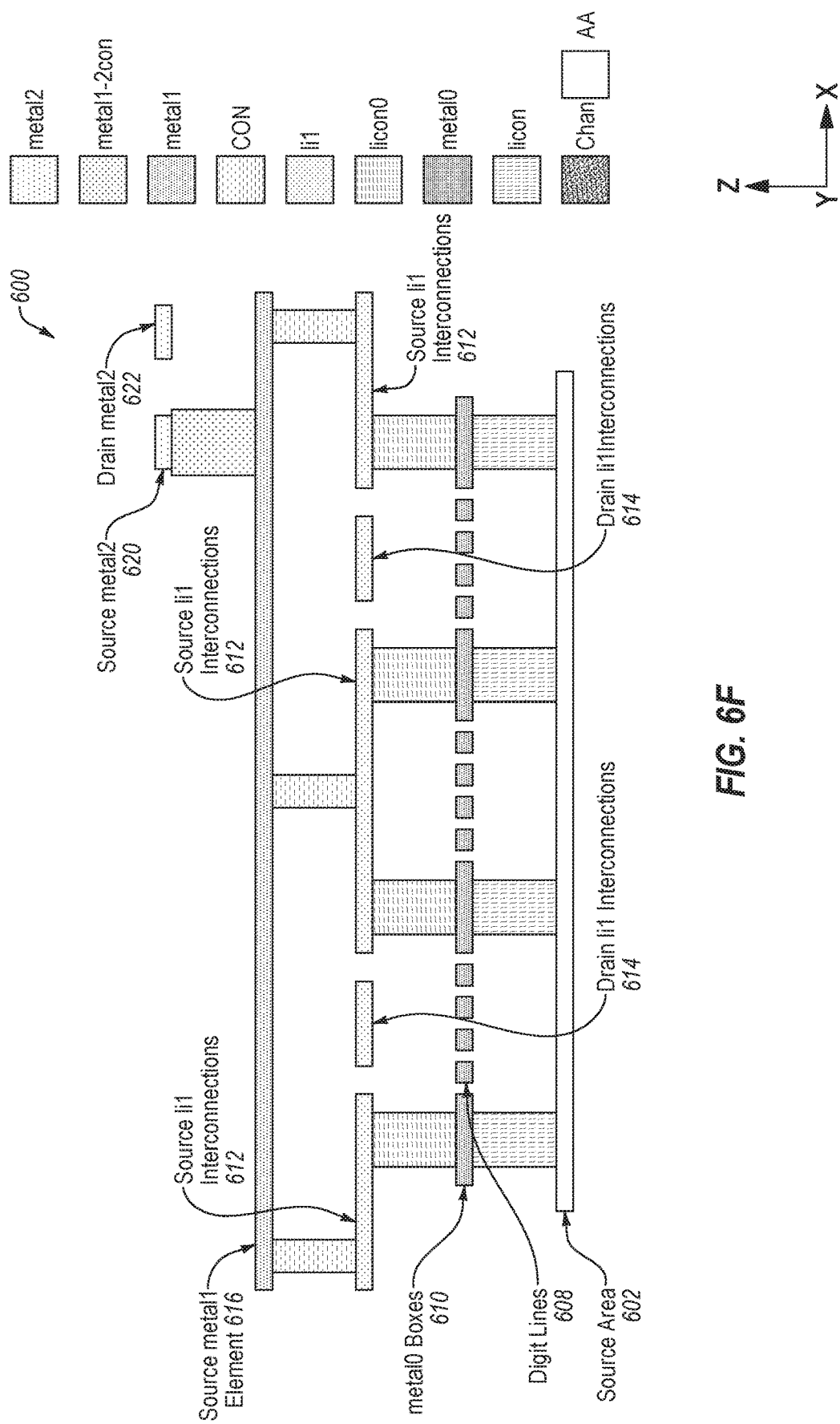
FIG. 6F-FIG. 6G are sectional diagrams illustrating additional views the example sense-amplifier driver of FIG. 6A-FIG. 6E in accordance with at least one embodiment of the present disclosure.
Figure 6G:
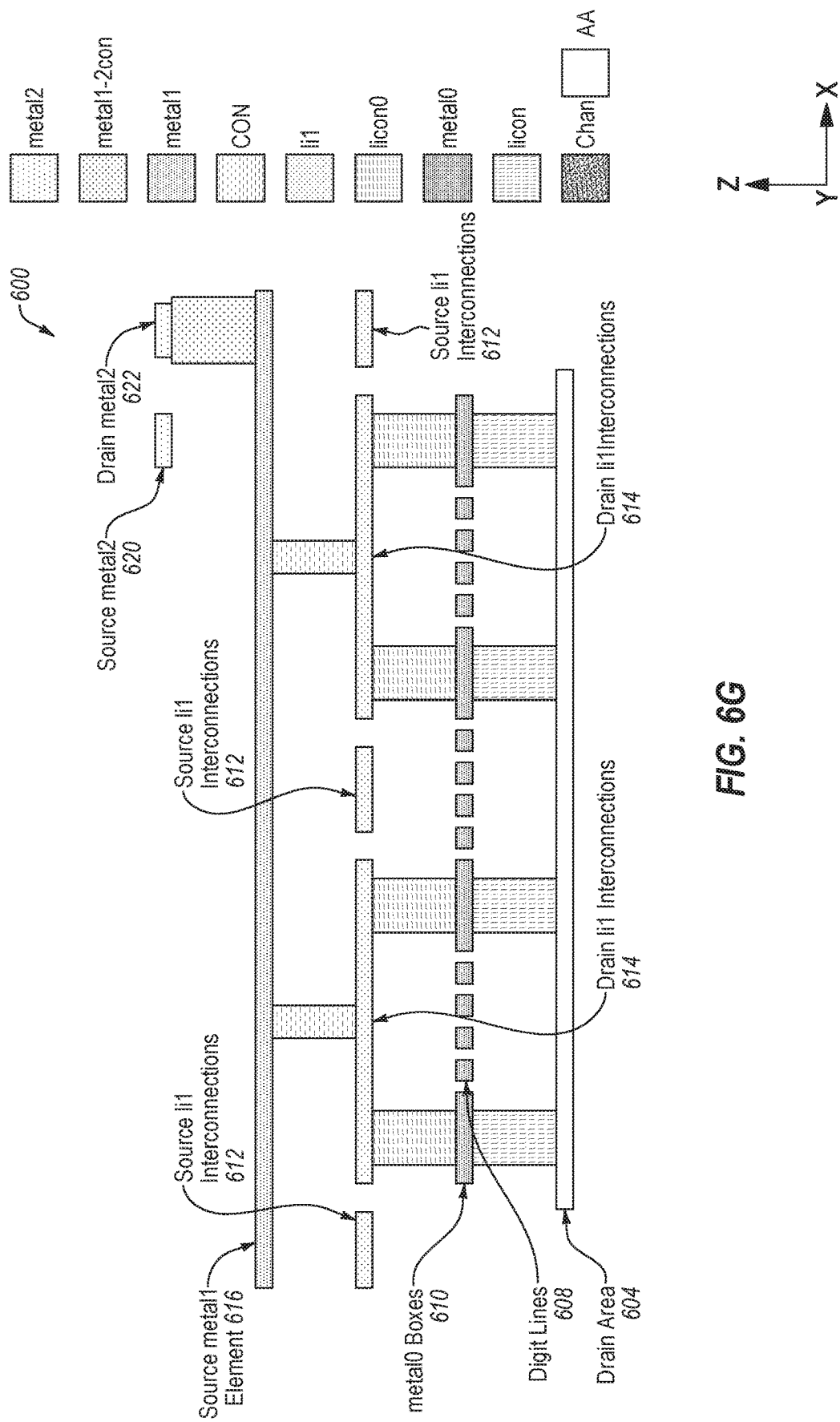

FIG. 6F and FIG. 6G are sectional diagrams illustrating additional views of sense-amplifier driver 600 in accordance with at least one embodiment of the present disclosure.

FIG. 6F illustrates source metal1 element 616 extending in the x-direction above portions of source li1 interconnections 612 which extend in the x-direction above one of source areas 602, which also extends in the x-direction. FIG. 6F also illustrates metal0 boxes 610 between source li1 interconnections 612 and the one of source areas 602. FIG. 6F also illustrates various inter-layer contacts in the licon layer, the licon0 layer, the CON layer, and the metal1-2con layer. FIG. 6F also illustrates portions of drain li1 interconnections 614 interspersed between the portions of source li1 interconnections 612.

FIG. 6F also illustrates digit lines 608, source metal2 620, and drain metal2 622 which extend the y-direction. As can be seen in FIG. 6F, there is an inter-layer contact between source metal2 620 and source metal1 element 616.

FIG. 6G illustrates drain metal1 element 618 which extends in the x-direction above portions of drain li1 interconnections 614 which extend in the x-direction above one of drain areas 604, which extends in the x-direction. FIG. 6G also illustrates metal0 boxes 610 between drain li1 interconnections 614 and the one of drain areas 604. FIG. 6G also illustrates various inter-layer contacts in the licon layer, the licon0 layer, the CON layer, and the metal1-2con layer. FIG. 6G also illustrates portions of source li1 interconnections 612 interspersed between the portions of drain li1 interconnections 614.

FIG. 6G also illustrates digit lines 608, source metal2 620, and drain metal2 622 which extend the y-direction. As can be seen in FIG. 6G, there is an inter-layer contact between drain metal2 622 and drain metal1 element 618.

Various shapes, arrangements, and numbers of source areas, drain areas, source li1 interconnections, drain li1 interconnections, and portions thereof have been contemplated. FIG. 7A-FIG. 7G illustrate several examples of source li1 interconnections, drain li1 interconnections, and portions thereof. For example, one or more source li1 interconnections and/or drain li1 interconnections may be shaped like: an "E," two or more stacked "E"s, an "F" stacked on an "E," an "E" combined with a backwards "E," an "F," an upside-down "F" on top of an "F," an "H," two or more combined "H"s, a "+," and/or two or more stacked "+"s, and any of the foregoing rotated or flipped.

FIG. 7A-FIG. 7G are layout diagrams illustrating various examples of configurations of a layer of a sense-amplifier driver in accordance with various embodiments of the present disclosure. In particular, each of FIG. 7A-FIG. 7G illustrates a different configuration of the li1 layer of a sense-amplifier driver.

Figure 7A:
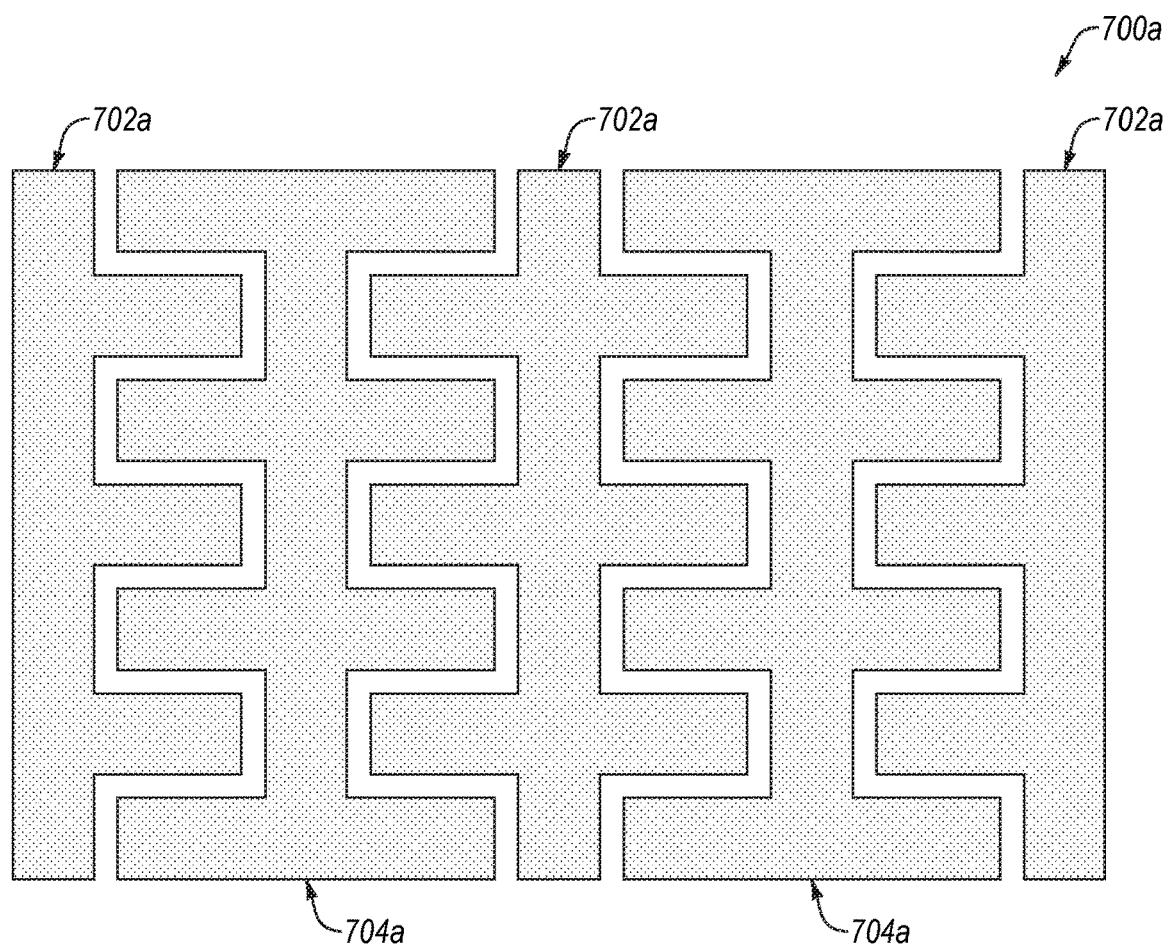
FIG. 7A-FIG. 7G are layout diagrams illustrating various examples of configurations of a layer of an example sense-amplifier driver in accordance with at least one embodiment of the present disclosure.

For example, FIG. 7A illustrates li1 layer 700*a* including li1 interconnection 702*a* and li1 interconnection 704*a*. li1 layer 700*a* may include material similar to the li1 layer of any or all of sense-amplifier driver 400, sense-amplifier driver 500, and/or sense-amplifier driver 600. li1 layer 700*a* may be configured to be positioned above a channel/AA layer.

In particular, li1 layer 700*a* may be configured to be positioned above a channel/AA layer including either four drain areas and three source areas interspersed therebetween or four source areas and three drain areas interspersed therebetween. For example, there may be four drain areas with three source areas interspersed therebetween (e.g., in the case that li1 layer 700*a* is part of an NMOS transistor). In such a case, li1 interconnection 702*a* may be source li1 interconnections (e.g., the same as or substantially similar to source li1 interconnections 514) and li1 interconnection 704*a* may be drain li1 interconnections (e.g., the same as or substantially similar to drain li1 interconnections 512). As another example, there may be four source areas with three drain areas interspersed therebetween (e.g., in the case that li1 layer 700*a* is part of a PMOS transistor). In such a case, li1 interconnection 702*a* may be drain li1 interconnections (e.g., the same as or substantially similar to drain li1 interconnections 614) and li1 interconnection 704*a* may be source li1 interconnections (e.g., the same as or substantially similar to source li1 interconnections 612).

Although not illustrated, the systems, methods, and/or devices of the present disclosure, may include a configuration similar to li1 layer 700*a* wherein li1 interconnection 702*a* includes four portions extending in the x-direction ("x-direction portions") (including at the outermost extent) and li1 interconnection 704*a* includes three x-direction portions. Such a configuration may resemble the configuration of source li1 interconnections 612 and drain li1 interconnections 614.

FIG. 7A illustrates one example of increasing the number of drain areas and source areas and corresponding x-direction portions beyond what was illustrated and described with regard to FIG. 5A-FIG. 6G. The systems, methods, and/or devices of the present disclosure may include any number of drain areas and source areas and corresponding x-direction portions.

Additionally, although not illustrated, the systems, methods, and/or devices of the present disclosure may include any number of interconnections. For example, although FIG. 7A illustrates three li1 interconnection 702*a* and two li1 interconnection 704*a*, there may be more or fewer.

Figure 7B:
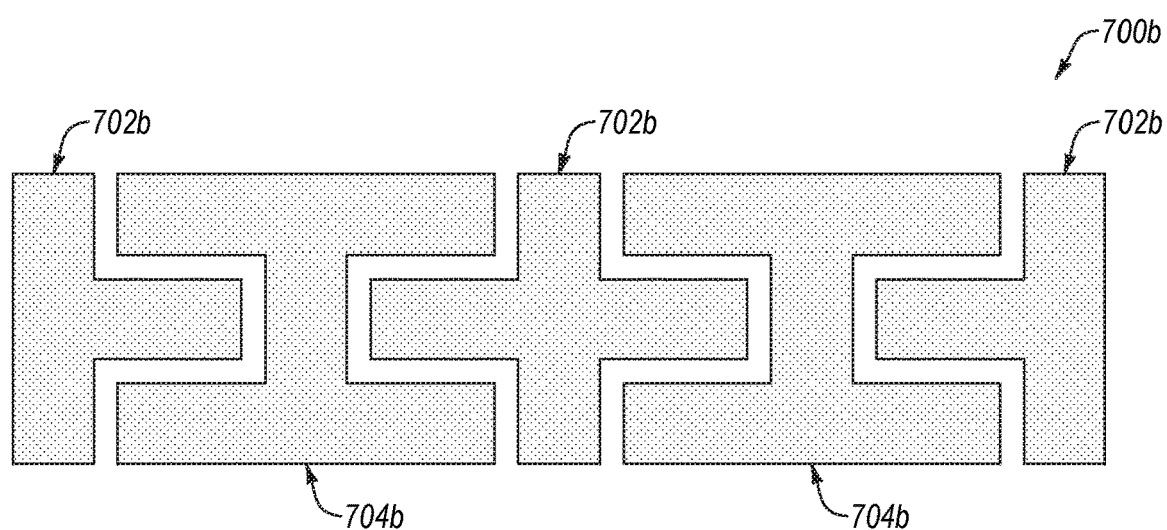

FIG. 7B illustrates one example of decreasing the number of drain areas and source areas and corresponding x-direction portions below what is illustrated and described with regard to FIG. 5A-FIG. 6G. The systems, methods, and/or devices of the present disclosure may include any number of drain areas and source areas and corresponding x-direction portions.

Figure 7C:
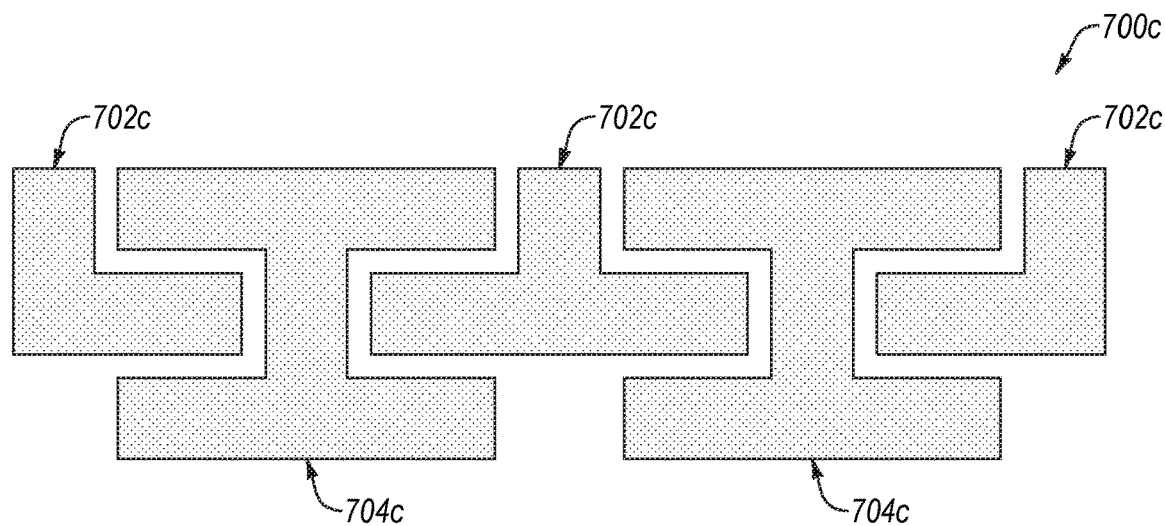
Figure 7D:
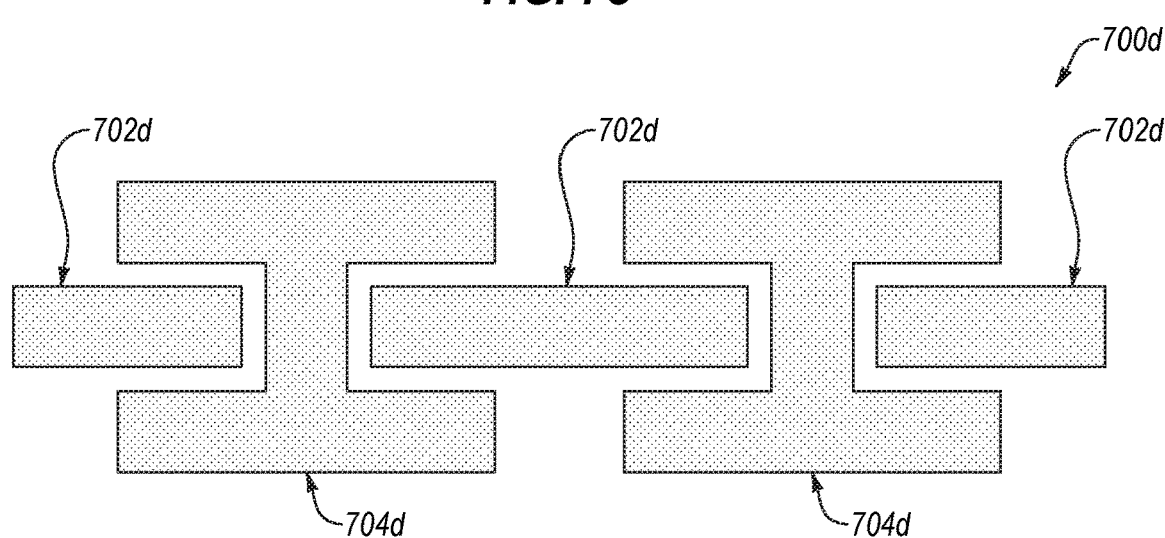

FIG. 7C and FIG. 7D illustrate that in some instances, portions extending in the y-direction ("y-direction portions") may be omitted from systems, methods, and/or devices of the present disclosure. In particular, y-direction portions that do not connect x-direction portions may be omitted. Although this is illustrated using a li1 layer including only three total source and drain areas and only three corresponding x-direction portions, the concept illustrated by FIG. 7C and FIG. 7D may apply to li1 layers of any number of x-direction portions.

In other cases, y-direction portions may be used for connections to the metal1 layer. For example, in the case of a PSA driver transistor, some of the y-direction portions of li1 interconnection 702*c* may be used to connect to a source metal1 element or drain metal1 element.

Figure 7E:
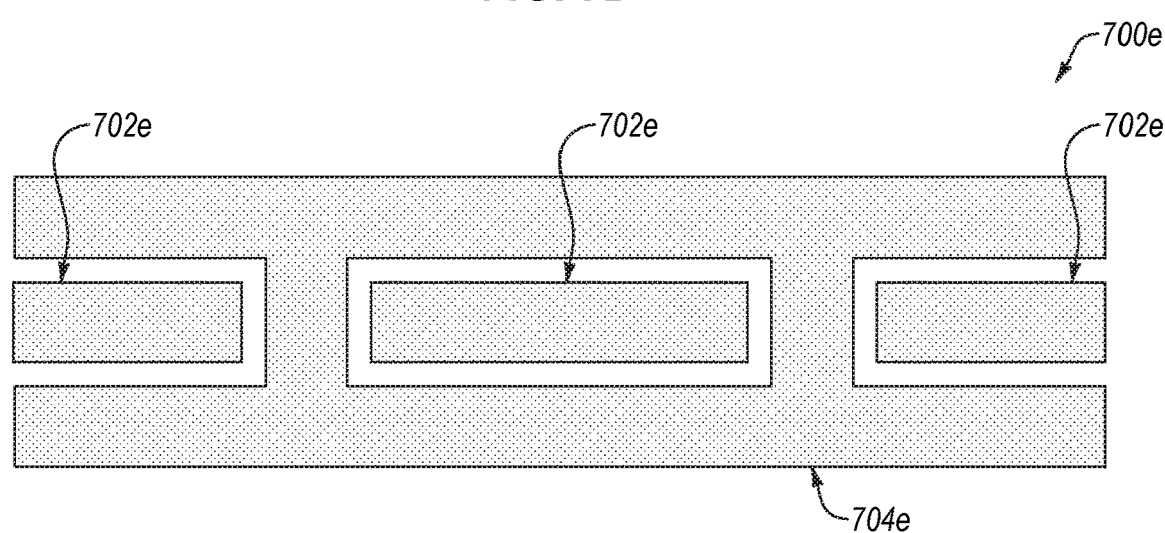

FIG. 7E illustrates that in some instances, where y-direction portions that do not connect x-direction portions have been omitted and the outermost x-direction portions may be extended e.g., to become continuous.

Figure 7F:
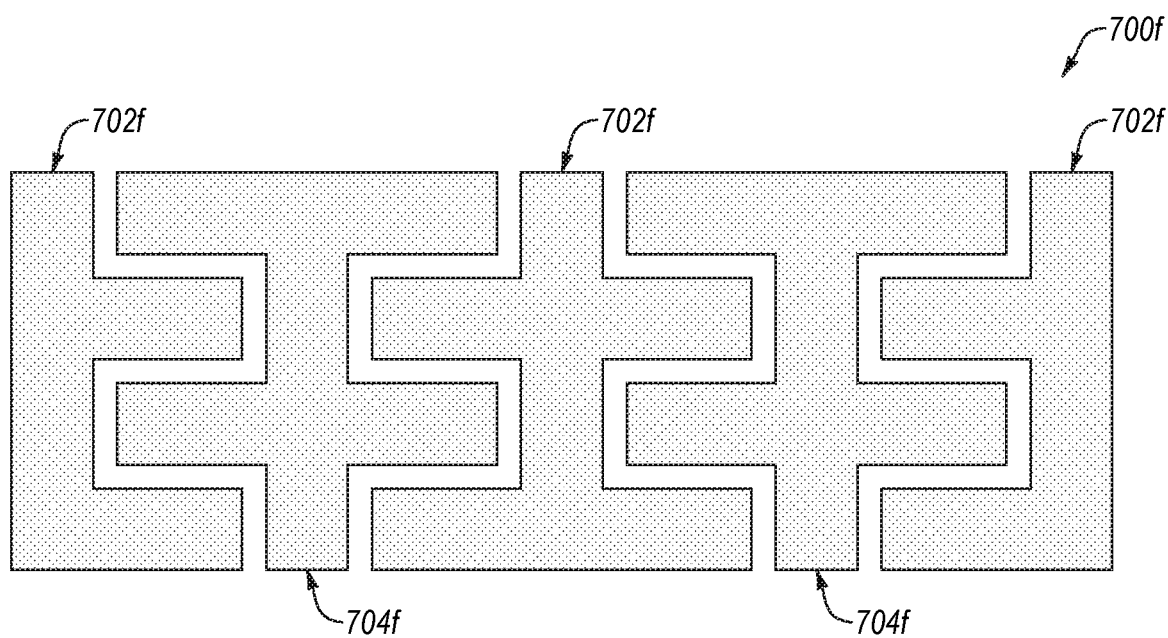

FIG. 7F illustrates that the number of drain areas and the number of source areas may be equal, resulting in li1 interconnection 702*f* and li1 interconnection 704*f* that have the same number of x-direction portions.

Figure 7G:
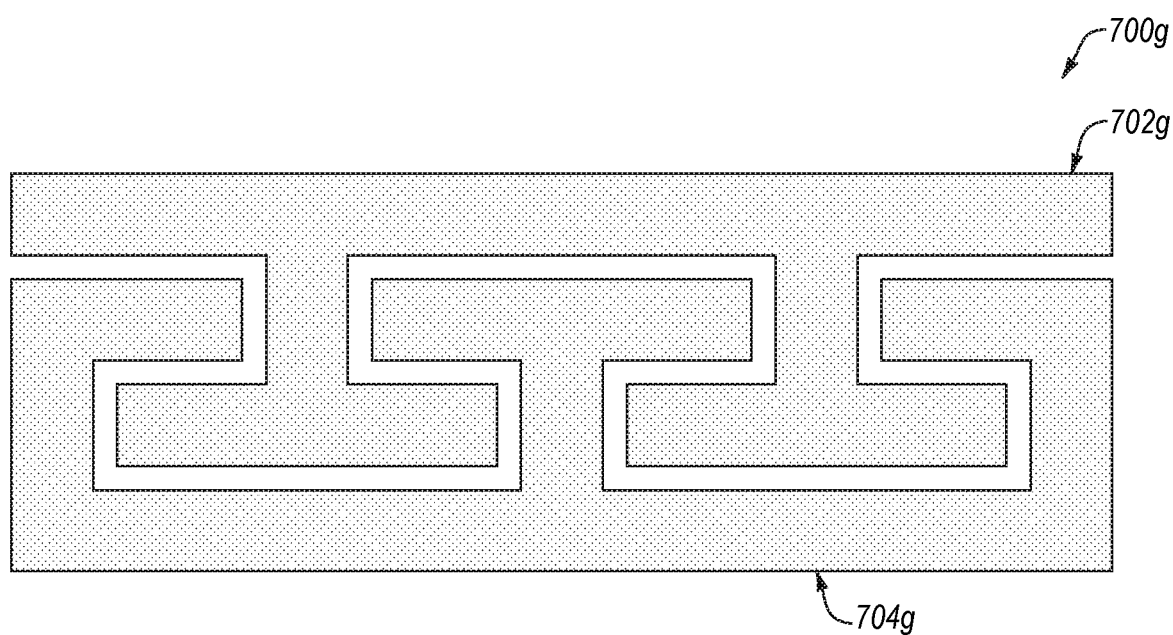

FIG. 7G illustrates that in cases such as those illustrated in FIG. 7F, y-direction portions (e.g., portions that do not connect x-direction portions) may be omitted. And, further, in such cases, x-direction portions may be extended.

Figure 8:
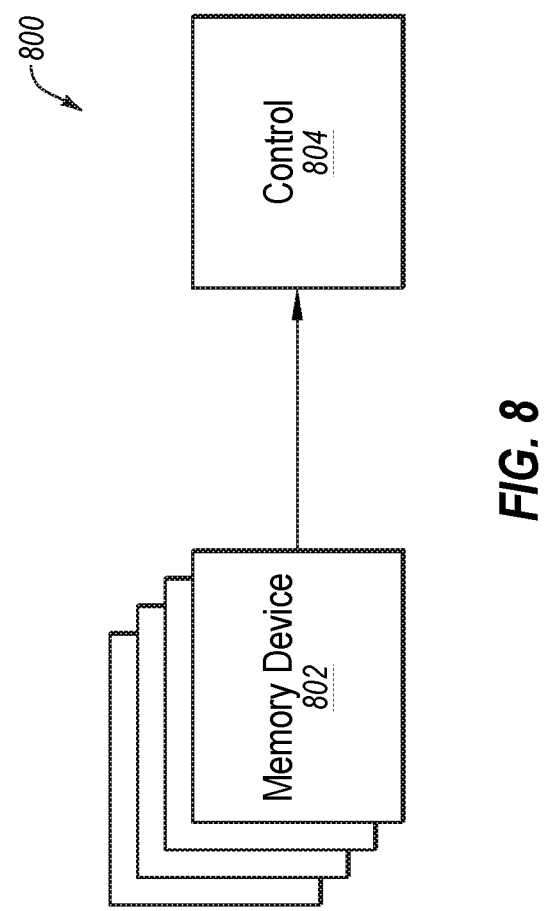
FIG. 8 is a simplified block diagram illustrating an example memory system, in accordance with at least one embodiment of the present disclosure.

FIG. 8 is a simplified block diagram illustrating memory system 800 implemented in accordance with at least one embodiment of the present disclosure. Memory system 800, which may include, for example, a semiconductor device, includes a number of memory devices 802 and controller 804. Controller 804 may be operatively coupled with memory devices 802 so as to convey command/address signals (e.g., command/address signals received by command terminals 112 and/or address terminals 110 of FIG. 1) to memory devices 802.

At least one memory device (e.g., memory device 100 of FIG. 1) 802 of memory system 800 may include one or more sense amplifiers and one or more sense-amplifier drivers (e.g., sense-amplifier driver 500 and/or sense-amplifier driver 600), according to one or more embodiments disclosed herein.

An electronic system is also disclosed. According to various embodiments, the electronic system may include a memory device including a number of memory dies, each memory die having an array of memory cells. Each memory cell may include an access transistor and a storage element operably coupled with the access transistor.

FIG. 9 is a simplified block diagram illustrating electronic system 900 implemented in accordance with at least one embodiment of the present disclosure. Electronic system 900 includes at least one input device 902, which may include, for example, a keyboard, a mouse, or a touch screen. Electronic system 900 further includes at least one output device 904, such as a monitor, a touch screen, or a speaker. Input device 902 and output device 904 are not necessarily separable from one another. Electronic system 900 further includes storage device 906. Input device 902, output device 904, and storage device 906 may be coupled to processor 908. Electronic system 900 further includes memory device 910 coupled to processor 908. Memory device 910 may include at least a portion of memory system 800 of FIG. 8. Electronic system 900 may include, for example, a computing, processing, industrial, or consumer product. For example, without limitation, electronic system 900 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A driver for a sense amplifier comprising:
   two or more drain active areas extending in a first direction;
   two or more source active areas extending in the first direction, one of the two or more source active areas positioned between two of the two or more drain active areas;
   a drain interconnection including two or more first drain-interconnection portions which extend in the first direction and one or more second drain-interconnection portions extending in a second direction between the two or more first drain-interconnection portions, each of the two or more first drain-interconnection portions positioned above a respective one of the two or more drain active areas; and
   a source interconnection including two or more first source-interconnection portions extending in the first direction and one or more second source-interconnection portions extending in the second direction between the two or more first source-interconnection portions, each of the two or more first source-interconnection portions positioned above a respective one of the two or more source active areas,
   wherein the driver is configured to provide voltage to the sense amplifier, and wherein one or more of the two or more drain active areas are to be electrically coupled to the sense amplifier through a metal line in a metal layer between a gate layer including the two or more drain active areas and an interconnection layer including the drain interconnection.

2. The driver of claim 1, wherein the drain interconnection comprises a single metal layer.

3. The driver of claim 1, wherein the source interconnection comprises a single metal layer.

4. The driver of claim 1, wherein the drain interconnection is only in a metal layer and the source interconnection is only in the metal layer.

5. The driver of claim 4, wherein the metal layer is the second metal layer above the two or more drain active areas and the two or more source active areas.

6. The driver of claim 1, wherein the first drain-interconnection portions are electrically coupled to the two or more drain active areas through first inter-layer contacts and the first source-interconnection portions are electrically coupled to the two or more source active areas through second inter-layer contacts.

7. The driver of claim 1, wherein one of the drain interconnection and the source interconnection is shaped like two connected "+" symbols and the other of the drain interconnection and the source interconnection is shaped like two connected "H" characters.

8. The driver of claim 1, further comprising:
another source interconnection, the drain interconnection positioned between the source interconnection and the other source interconnection; and
a source element positioned above the source interconnection, the drain interconnection, and the other source interconnection, the source element electrically coupled to the source interconnection and the other source interconnection through inter-layer contacts.

9. The driver of claim 8, wherein the source element is electrically coupled to a voltage line.

10. The driver of claim 8, further comprising:
another drain interconnection, the other source interconnection positioned between the drain interconnection and the other drain interconnection; and
a drain element positioned above the source interconnection, the drain interconnection, the other source interconnection, and the other drain interconnection, the drain element electrically coupled to the drain interconnection and the other drain interconnection through other inter-layer contacts.

11. The driver of claim 10, wherein the driver is configured to provide voltage to a sense amplifier, wherein the source element is electrically coupled to a voltage line and wherein the drain element is electrically coupled to the sense amplifier through a metal line in a metal layer above the drain element.

12. An apparatus, comprising:
a transistor having first, second, and third diffusion regions extending in a first direction, the second diffusion region positioned between the first and third diffusion regions, the first, second, and third diffusion regions are arranged in a gate layer;
first, second, and third pluralities of contact plugs provided on the first, second, and third diffusion regions, respectively;
metal lines in a metal layer, the metal layer above the gate layer without an intervening conductive layer; and
a first interconnection wiring extending in a second direction, the second direction crossing the first direction, the interconnection wiring arranged in an interconnection layer above the metal layer without an intervening conductive layer, the first interconnection wiring including:
a first portion above the first diffusion region, the first portion electrically coupled to at least two of the first plurality of contact plugs;
a second portion above the second diffusion region, the second portion not electrically coupled to any of the second plurality of contact plugs; and
a third portion above the third diffusion region, the third portion electrically coupled to at least two of the third plurality of contact plugs;
wherein each of the first and third portions is wider in the first direction than the second portion.

13. The apparatus of claim 12, further comprising:
a second interconnection wiring extending in the second direction, the second interconnection wiring including:
a fourth portion above the first diffusion region, the fourth portion not electrically coupled to any of the first plurality of contact plugs;
a fifth portion above the second diffusion region, the fifth portion electrically coupled to at least two of the second plurality of contact plugs; and
a sixth portion above the third diffusion region, the sixth portion not electrically coupled to any of the third plurality of contact plugs;
wherein the fifth portion is wider in the first direction than each of the fourth and sixth portions.

14. The apparatus of claim 12, wherein the transistor is provided between a voltage supply and a source node of a sense amplifier.

15. The apparatus of claim 14, wherein the transistor is electrically coupled to the voltage supply and the source node.

16. The apparatus of claim 12, further comprising a plurality of bit lines extending in the second direction, the plurality of bit lines above the transistor and below the first interconnection wiring.

17. A memory device comprising a driver for a sense amplifier, the driver comprising:
an active layer comprising:
two drain active areas extending in a first direction; and
a source active area extending in the first direction, the source active area positioned laterally between the two drain active areas;
an interconnection layer above the active layer, the interconnection layer comprising:
a drain interconnection including two first drain-interconnection portions extending in the first direction and a second drain-interconnection portion extending in a second direction between the two first drain-interconnection portions, each of the two first drain-interconnection portions positioned above and electrically coupled to a respective one of the two drain active areas through drain inter-layer contacts; and
a source interconnection extending in the first direction above the source active area, the source interconnection electrically coupled to the source active area through a source inter-layer contact; and
a zeroth metal layer between the active layer and the interconnection layer, the zeroth metal layer comprising:
a first metal line electrically coupled to a drain active area of two drain active areas and the drain interconnection through zeroth-metal inter-layer contacts, the first metal line configured to electrically couple the drain active area to a source of a sense-amplifier transistor.

18. The memory device of claim 17, wherein:
the interconnection layer further comprises:
another source interconnection, the drain interconnection positioned laterally between the source interconnection and the other source interconnection; and the driver further comprises a first metal layer above the interconnection layer, the first metal layer comprising:
    a source element positioned above the source interconnection, the drain interconnection, and the other source interconnection, the source element electrically coupled to the source interconnection and the other source interconnection through source-interconnection inter-layer contacts.

19. The memory device of claim 18, further comprising:
a second metal layer above the first metal layer, the second metal layer comprising:
    a second metal line electrically coupled to the source element through a second-metal inter-layer contact, the second metal line configured to electrically couple the source element to a voltage line.

20. The memory device of claim 18, wherein:
the interconnection layer further comprises:
    another drain interconnection, the other source interconnection positioned laterally between the drain interconnection and the other drain interconnection;

the first metal layer further comprises:
    a drain element positioned above the source interconnection, the other source interconnection, the drain interconnection, and the other source interconnection, the drain element electrically coupled to the drain interconnection and the other drain interconnection through drain-interconnection inter-layer contacts; and the driver further comprises a second metal layer above the first metal layer, the second metal layer comprising:
    a first metal line electrically coupled to the source element through a source-element inter-layer contact, the first metal line configured to electrically couple the source element to a voltage line; and
    a second metal line electrically coupled to the drain element through a drain-element inter-layer contact, the second metal line configured to electrically couple the drain element to a source of a sense-amplifier transistor.

\* \* \* \* \*